(12) United States Patent
Kanno

(10) Patent No.: US 8,654,028 B2
(45) Date of Patent: Feb. 18, 2014

(54) ELECTROMAGNETIC WAVE FILTER APPARATUS WITHOUT DEGRADING RADIATION PATTERN OF ANTENNA

(75) Inventor: Hiroshi Kanno, Osaka (JP)

(73) Assignee: Panasonic Corporation, Osaka (JP)

( * ) Notice: Subject to any disclaimer, the term of this patent is extended or adjusted under 35 U.S.C. 154(b) by 634 days.

(21) Appl. No.: 12/918,385

(22) PCT Filed: Nov. 26, 2009

(86) PCT No.: PCT/JP2009/006381
§ 371 (c)(1),
(2), (4) Date: Aug. 19, 2010

(87) PCT Pub. No.: WO2010/073486
PCT Pub. Date: Jul. 1, 2010

(65) Prior Publication Data
US 2010/0328186 A1    Dec. 30, 2010

(30) Foreign Application Priority Data
Dec. 26, 2008    (JP) ................................ 2008-333447

(51) Int. Cl.
*H01Q 1/42* (2006.01)
*H01Q 15/02* (2006.01)

(52) U.S. Cl.
USPC ........................................ 343/872; 343/909

(58) Field of Classification Search
USPC ........... 343/872, 909; 333/202, 204, 205, 212
See application file for complete search history.

(56) References Cited

U.S. PATENT DOCUMENTS

| 4,125,841 | A | * | 11/1978 | Munk | 343/909 |
| 7,095,627 | B2 | | 8/2006 | Yokota | |
| 7,277,065 | B2 | * | 10/2007 | Wu et al. | 343/909 |
| 2004/0206527 | A1 | | 10/2004 | Yokota | |
| 2005/0046523 | A1 | | 3/2005 | Wu et al. | |

FOREIGN PATENT DOCUMENTS

| JP | 60-070691 | 4/1985 |
| JP | 11-248835 | 9/1999 |

(Continued)

OTHER PUBLICATIONS

English translation of International Preliminary Report on Patentability and Written Opinion of the International Searching Authority, issued Aug. 16, 2011, in PCT/JP2009/006381.

(Continued)

*Primary Examiner* — Michael C Wimer
(74) *Attorney, Agent, or Firm* — Wenderoth, Lind & Ponack, L.L.P.

(57) ABSTRACT

An electromagnetic wave filter apparatus includes: a shield conductor; a shield aperture provided in the shield conductor; a plurality of strip conductors, each of which is connected to the shield conductor at both ends thereof, and which divide the shield conductor into a plurality of apertures; and a plurality of stub conductors provided at intervals on each of the strip conductors. Each of the stub conductors prevents a current with a predetermined frequency from flowing through a corresponding strip conductor due to an electromagnetic wave with the predetermined frequency passing through the electromagnetic wave filter apparatus. Thus, the electromagnetic wave filter apparatus passes the electromagnetic wave with the predetermined frequency without exerting a substantial influence on radiation of the electromagnetic wave with the predetermined frequency.

14 Claims, 20 Drawing Sheets

(56) References Cited

FOREIGN PATENT DOCUMENTS

| | | |
|---|---|---|
| JP | 2001-284945 | 10/2001 |
| JP | 2002-033592 | 1/2002 |
| JP | 2004-297763 | 10/2004 |
| JP | 2005-317945 | 11/2005 |
| JP | 2007-095830 | 4/2007 |
| JP | 2007-143044 | 6/2007 |
| JP | 2008-004901 | 1/2008 |
| WO | 2008/054324 | 5/2008 |

OTHER PUBLICATIONS

International Search Report issued Feb. 23, 2010 in International (PCT) Application No. PCT/JP2009/006381 (in English).

Office Action issued Aug. 22, 2013 in corresponding Chinese Application No. 200980106504.9 (with English translation).

* cited by examiner

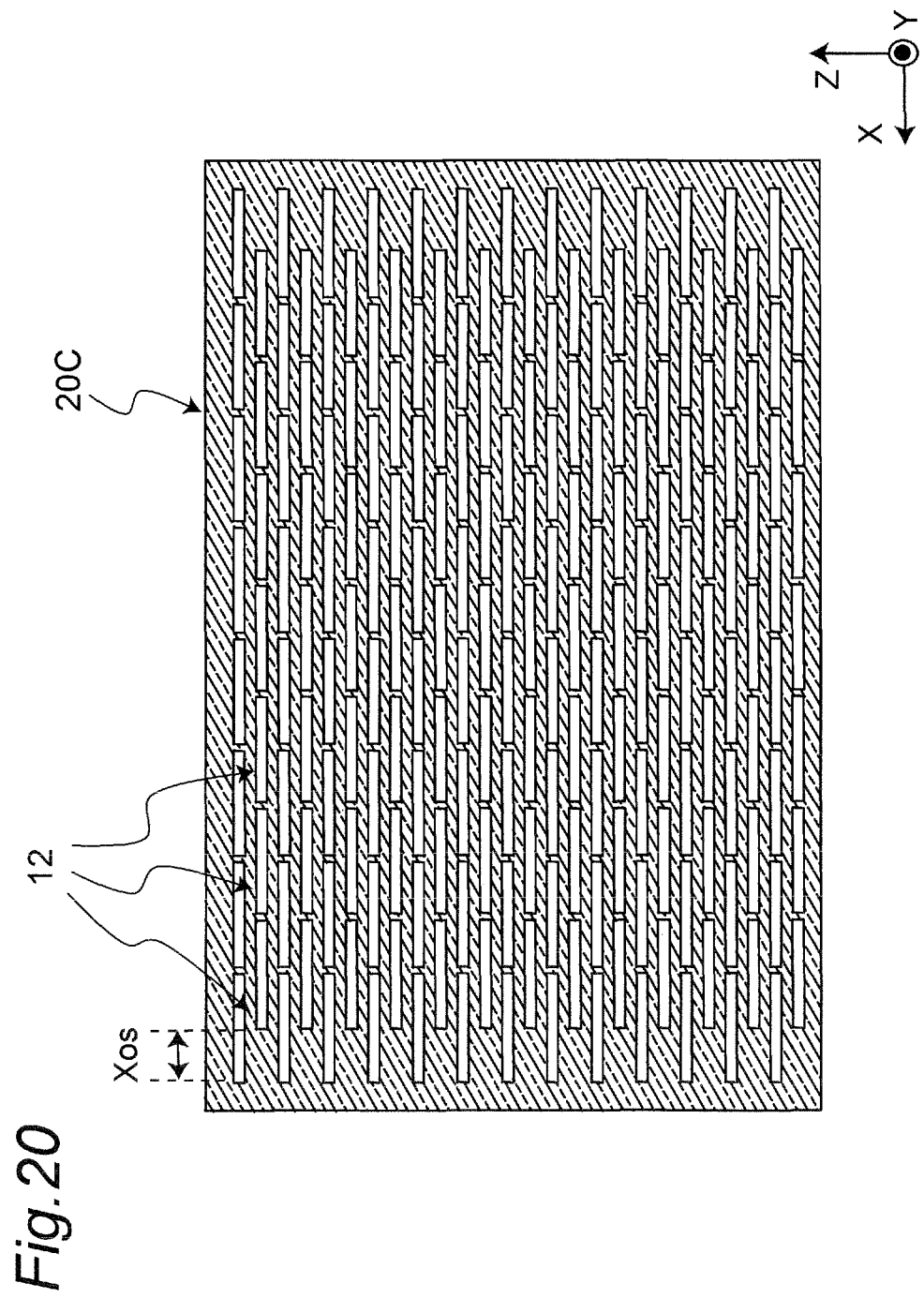

Fig.21

| | SIZE OF APERTURE 12 | FORWARD GAIN (dBi) | GAIN DEGRADATION (dB) | HALF WIDTH (deg) | |
|---|---|---|---|---|---|
| | | | | E-PLANE | H-PLANE |
| FREE SPACE | | 5.35 | | 94 | 83 |
| FIRST IMPLEMENTATION EXAMPLE (Fig. 7) | 2mm×10mm | 4.91 | -0.44 | 95 | 82 |
| SECOND COMPARISON EXAMPLE (Fig. 17) | 2mm×10mm | 2.69 | -2.66 | 126 | 79 |
| SECOND IMPLEMENTATION EXAMPLE (Fig. 18) | 2mm×2mm | 4.90 | -0.45 | 97 | 80 |
| THIRD COMPARISON EXAMPLE (Fig. 3) | 2mm×2mm | 2.87 | -2.47 | 151 | 77 |
| THIRD IMPLEMENTATION EXAMPLE (Fig. 3) | 1.45mm×1.45mm | 4.88 | -0.47 | 97 | 80 |
| FOURTH COMPARISON EXAMPLE (Fig. 19) | 1.8mm×0.09mm | 3.31 | -2.04 | 159 | 76 |
| FIFTH COMPARISON EXAMPLE (Fig. 20) | 1.8mm×0.09mm | 4.80 | -0.55 | 110 | 75 |

Fig.23

|  | SIZE OF APERTURE 12 | RETURN LOSS (dB) |
|---|---|---|
| FREE SPACE |  | −14.20 |
| FIRST IMPLEMENTATION EXAMPLE (Fig. 7) | 2mm×10mm | −12.10 |
| SECOND COMPARISON EXAMPLE (Fig. 17) | 2mm×10mm | −8.85 |
| SECOND IMPLEMENTATION EXAMPLE (Fig. 3) | 2mm×2mm | −12.60 |
| THIRD COMPARISON EXAMPLE (Fig. 18) | 2mm×2mm | −8.07 |
| THIRD IMPLEMENTATION EXAMPLE (Fig. 3) | 1.45mm×1.45mm | −12.90 |
| FOURTH COMPARISON EXAMPLE (Fig. 19) | 1.8mm×0.09mm | −8.67 |
| FIFTH COMPARISON EXAMPLE (Fig. 20) | 1.8mm×0.09mm | −10.40 |

ELECTROMAGNETIC WAVE FILTER APPARATUS WITHOUT DEGRADING RADIATION PATTERN OF ANTENNA

TECHNICAL FIELD

The present invention relates to an electromagnetic wave filter apparatus, which is required when providing electronic equipment with an antenna apparatus for transmitting and receiving radio frequency analog signals or digital signals in the microwave band and the millimeter-wave band, etc. The present invention relates to an electromagnetic wave filter apparatus, e.g., in electronic equipment with wireless communication capability for video transmission, the electromagnetic wave filter apparatus being capable of suppressing undesired noise radiation so that noise generated from the inside of the electronic equipment does not radiate to outer space, in particular, without degrading the radiation pattern at a frequency used in the wireless communication capability, and the present invention also relates to a radome with such an electromagnetic wave filter apparatus.

BACKGROUND ART

In recent years, the wireless technologies for video transmission have been widely studied, and a standard using millimeter-wave signals in the 60 GHz band is now being implemented. Although an active circuit operable in the 60 GHz band has been implemented as one chip by using the CMOS technologies with fine processing, it is difficult to increase the circuit output power because of a low drive voltage for transistors in the circuit. In addition, diffraction propagation can not be expected for 60 GHz-band electromagnetic waves, and thus, it is necessary to ensure a line of sight between a transmitter and a receiver. In the case of indoor wireless video transmission, since it is assumed that a user may often block a communication path, developers are weighing whether to use the beam steering technique for ensuring a line of sight while avoiding the blocking of the communication path by using reflections on walls, ceiling and floor. The aforementioned problem of low output power characteristics of a CMOS device is overcome by means of the array antenna technique in which powers from multiple antenna elements are spatially combined. However, in the millimeter-wave band with a shorter wavelength, the propagation loss becomes serious as compared to that of the microwave band, and thus, it is necessary to steer the antenna beam while maintaining a very high antenna gain. That is, a video transmission module operable in the 60 GHz-band needs to maintain its designed gain in any communication direction even after being mounted on equipment.

On the other hand, regulations require that undesired electromagnetic wave components radiated from electronic equipment be suppressed to a certain level or less in order to avoid adverse influences on other neighboring equipment. Accordingly, it is a common practice to use a shield structure for a housing of the equipment so as to prevent undesired electromagnetic waves from leaking from the inside of the equipment. Hence, in the case that a wireless communication interface is provided within the housing of the electronic equipment, then, conventionally, a transmitting and receiving antenna is mounted external to the equipment, or a part of the shield structure inside which the antenna is positioned is cut out so that an undesired electromagnetic radiation level satisfies the regulations.

Patent Literature 1 pertains to a radio radar apparatus that passes only radio waves with a certain frequency therethrough and suppresses the influence of external noise radio waves. The radar apparatus of Patent Literature 1 includes a shield structure made of a conductor and covering the radar's main body. The shield structure has a frequency-selective screen portion formed at at least its portion in front of an antenna. The screen portion is divided into a plurality of apertures by additional conductors whose both ends are short-circuited to an outer edge of the screen portion, and thus, the screen portion can block noise electromagnetic waves with frequencies fL lower than a certain frequency fp. In addition, by setting the resonance frequency of each aperture to the frequency fp, the screen portion can pass electromagnetic waves with the frequency fp therethrough.

Patent Literature 2 pertains to an electromagnetic shield structure that passes only a specific electromagnetic wave therethrough and blocks all the other electromagnetic waves. Patent Literature 2 discloses the electromagnetic shield structure including a conductive layer provided with a plurality of apertures. It is possible to pass only electromagnetic waves with a certain frequency therethrough by adjusting each aperture's length, and thus, when combined with the shielding by the conductive layer, obtain the same effects as those obtained by the invention of Patent Literature 1. The smaller each aperture's width w, the better the performance, and the allowable range of the width w is about 5% or less of each aperture's length l. Patent Literature 2 reads, "if each aperture's width w is too large, the aperture's characteristics as slot antennas degrade", and according to this statement, it can be seen that each aperture is operated as a slot antenna. Although Patent Literature 2 discloses a configuration for handling both of horizontal polarization and vertical polarization, the basic principles are the same as those of the invention of Patent Literature 1.

Patent Literature 3 pertains to a shield structure that passes radio waves in a specific frequency band therethrough and provides high blocking characteristics in the other bands. The invention of Patent Literature 3 is also configured in a manner similar to those of the inventions of Patent Literatures 1 and 2, and the invention of Patent Literature 3 adjusts a plurality of apertures divided from a screen portion so that each aperture operates as a slot antenna at a certain frequency, and thus, electromagnetic waves with that frequency can pass through the apertures resonating in that frequency. The invention of Patent Literature 3 differs from the inventions of Patent Literatures 1 and 2, in that, the invention of Patent Literature 3 is further provided with band-pass filters that each short-circuit between two opposing portions of each aperture's outer edge at frequencies fH higher than a certain frequency fp. Accordingly, the invention of Patent Literature 3 not only can pass electromagnetic waves with the frequency fp and block electromagnetic waves with frequencies fL lower than the frequency fp, but also can block electromagnetic waves with the high frequencies fH higher than the frequency fp.

CITATION LIST

Patent Literature

PATENT LITERATURE 1: Japanese Patent Laid-open Publication No. H11-248835.
PATENT LITERATURE 2: Japanese Patent Laid-open Publication No. 2002-033592.
PATENT LITERATURE 3: Japanese Patent Laid-open Publication No. 2004-297763.

SUMMARY OF INVENTION

Technical Problem

However, prior art electromagnetic wave filter apparatuses have a problem that the radiation characteristics of the antenna apparatus shielded by the electromagnetic wave filter apparatus (e.g., contained within a radome or a shield structure) change from those obtained without the shielding. For example, Patent Literature 1 discloses that the pass-through coefficient of electromagnetic waves with the frequency fp can be maximized by optimizing the shape of the additional conductors for the screen portions, however, it does not provide any detailed description of a optimization technique with maintaining radiation characteristics over the radiation angles also including directions other than a main beam direction.

Although Patent Literature 2 also reads, "it is possible to improve energy efficiency for emitting electromagnetic waves with a certain frequency", it does not provide any description of maintaining the antenna radiation characteristics at the frequency fp whether or not to be shielded by an electromagnetic wave filter apparatus. Rather, Patent Literature 2 explicitly discloses that each aperture operates as a slot antenna, which implies that in principle, the antenna radiation characteristics change depending on whether with or without the shielding by the electromagnetic wave filter apparatus.

Patent Literature 3 also does not disclose, as with Patent Literature 1, how to suppress changes in the radiation characteristics of electromagnetic waves at the frequency fp passing through the screen portion. Patent Literature 3 reads, "each aperture operates as a slot antenna for electromagnetic waves with a frequency capable of passing through the aperture depending on the aperture's perimeter length", thus ensuring that electromagnetic waves with the frequency fp can pass through the apertures, but not ensuring that radiation characteristics are maintained even with the shielding by the electromagnetic wave filter apparatus.

In conclusion, it is difficult for any prior art to achieve the following two objects at the same time. The first object is to maintain antenna radiation characteristics at a certain frequency fp whether with or without shielding by an electromagnetic wave filter apparatus. For example, if the beam half-width is decreased due to the shielding, this limits an available space for communication. On the contrary, if the beam half-width is unnecessarily increased by providing an electromagnetic wave filter apparatus, this may possibly result in receiving undesired multiple interference waves. In addition, the gain degradation due to the shielding limits the coverage. In addition, there may be a case in which, when an electromagnetic wave filter apparatus is provided, null characteristics can not be obtained at an angle of radiation that is supposed to have null characteristics, and thus, it is difficult to avoid the influence of disturbing waves. The second object is to suppress the intensity of electromagnetic waves with frequencies fL lower than the frequency fp and passing through a screen portion, i.e., to improve the blocking characteristics of low-frequency noise components.

An object of the present invention is to provide an electromagnetic wave filter apparatus capable of avoiding the radiation characteristics of an antenna apparatus shielded by the electromagnetic wave filter apparatus from degrading at a certain frequency fp, and capable of reducing undesired radiation at frequencies fL lower than the frequency fp and suppressing disturbing waves, as with the prior arts.

Solution to Problem

According to a first aspect of the present invention, an electromagnetic wave filter apparatus for blocking passing electromagnetic waves with frequencies lower than a predetermined frequency is provided. The electromagnetic wave filter apparatus comprising: a ground conductor; a first aperture provided in the ground conductor; a plurality of strip conductors, each of which is connected to the ground conductor at both ends thereof, and which divide the first aperture into a plurality of second apertures; and a plurality of bandstop filters provided at intervals on each of the strip conductors. Each of the bandstop filters prevents a current with the predetermined frequency from flowing through a corresponding strip conductor due to an electromagnetic wave with the predetermined frequency passing through the electromagnetic wave filter apparatus, whereby the electromagnetic wave filter apparatus passes the electromagnetic wave with the predetermined frequency without exerting a substantial influence on radiation of the electromagnetic wave with the predetermined frequency.

In the electromagnetic wave filter apparatus, each of the bandstop filters is an open circuited stub conductor with a length corresponding to one-quarter of an effective wavelength at the predetermined frequency.

In the electromagnetic wave filter apparatus, each of the open circuited stub conductors has a T-shape or Y-shape.

In the electromagnetic wave filter apparatus, each of the open circuited stub conductors has a first conductor portion connected to a corresponding strip conductor; and second and third conductor portions branched off from a tip of the first conductor portion, and the second and third conductor portions have an equal line width and an equal length to each other.

In the electromagnetic wave filter apparatus, in each of the open circuited stub conductors, the second and third conductor portions are configured to be mirror symmetric with respect to a plane including the first conductor portion.

In the electromagnetic wave filter apparatus, each of the open circuited stub conductors is configured to be mirror symmetric with respect to a plane perpendicular to a longitudinal direction of a corresponding strip conductor in a position in which the open circuited stub conductor is connected to the corresponding strip conductor.

In the electromagnetic wave filter apparatus, in each of the strip conductors, the open circuited stub conductors are connected along a longitudinal direction of the strip conductor, and alternately connected in a first direction and a second direction opposite to each other.

In the electromagnetic wave filter apparatus, at least some of the strip conductors are provided parallel to each other. Further, in any two adjacent strip conductors among the parallel strip conductors, one of each pair of open circuited stub conductors close to each other between the strip conductors is connected in the first direction and the other open circuited stub conductor is connected in the second direction.

In the electromagnetic wave filter apparatus, at least a part of the conductor portions of each of the open circuited stub conductors is provided in parallel to a traveling direction of electromagnetic waves passing through the electromagnetic wave filter apparatus.

In the electromagnetic wave filter apparatus, in each of the strip conductors, the bandstop filters are provided at intervals of a length not corresponding to an N/2 wavelength at the predetermined frequency, where N is an integer.

In the electromagnetic wave filter apparatus, the strip conductors include: a plurality of first strip conductors provided in parallel to a third direction within a surface including the first aperture; and a plurality of second strip conductors provided in parallel to a fourth direction within the surface, intersecting the third direction.

In the electromagnetic wave filter apparatus, the first strip conductors are formed on a first surface of a double-sided printed wiring board, and the second strip conductors are formed on a second surface of the double-sided printed wiring board, Further, at least some of the first strip conductors and at least some of the second strip conductors are connected to each other by means of via conductors.

In the electromagnetic wave filter apparatus, in a printed wiring board including one or more conductor layers, the strip conductors and the bandstop filters are formed on one or more of the conductor layers, respectively.

According to a second aspect of the present invention, a radome having with the electromagnetic wave filter apparatus is provided.

Advantageous Effects of Invention

According to the electromagnetic wave filter apparatus of the present invention, it is possible to obtain regions on the strip conductors in which no radio frequency current with a certain frequency is generated, by providing the strip conductors with the bandstop filters, and thus avoid a degradation in the radiation characteristics of the radiated electromagnetic waves passing through the screen portion, which is a problem of prior art electromagnetic wave filter apparatuses.

According to the electromagnetic wave filter apparatus of the present invention, firstly, even when an antenna apparatus is shielded by the electromagnetic wave filter apparatus, it is possible to maintain the radiation characteristics of the antenna apparatus at a certain frequency, thus ensuring the area coverage of wireless communication equipment. Secondly, the electromagnetic wave filter apparatus can suppress undesired noise components radiated from the antenna apparatus and passing through the electromagnetic wave filter apparatus, and low-frequency electromagnetic waves of external disturbing waves incoming to the antenna apparatus and passing through the electromagnetic wave filter apparatus.

BRIEF DESCRIPTION OF DRAWINGS

FIG. 20 is a top view showing a configuration of an electromagnetic wave filter apparatus 20C according to a fifth comparison example.

FIG. 21 is a table showing effective gains and beam half-widths for implementation examples of the present invention and for comparison examples.

FIG. 23 is a table showing return losses for the implementation examples of the present invention and for the comparison examples.

DESCRIPTION OF EMBODIMENTS

Figure 1:
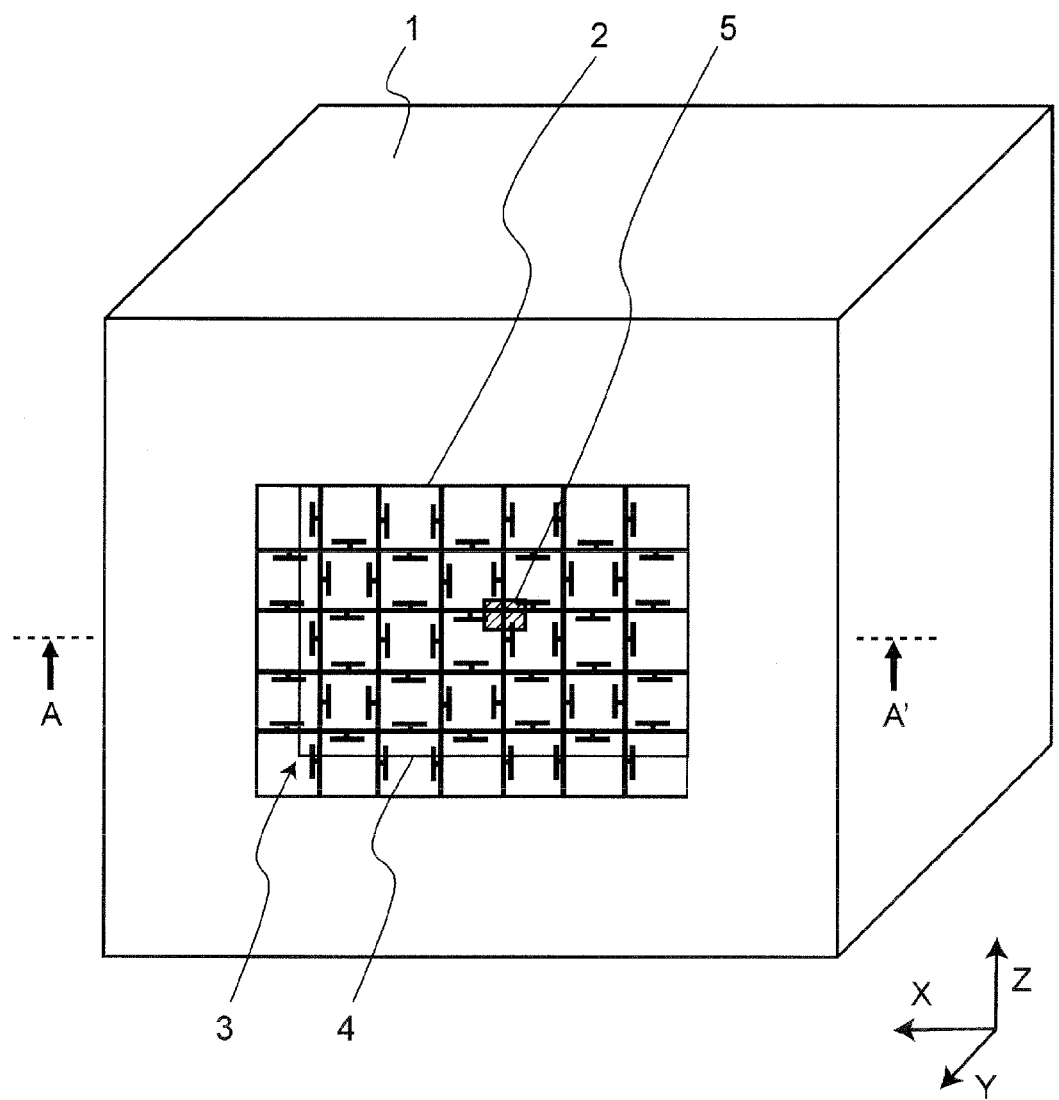
FIG. 1 is a perspective view showing a configuration of a radome with an electromagnetic wave filter apparatus 3 according to an embodiment of the present invention.

An embodiment of the present invention will be described below with reference to the drawings. For purposes of illustration, XYZ coordinates as shown in the drawings are introduced, and similar components are denoted by the same reference numerals.

Figure 2:
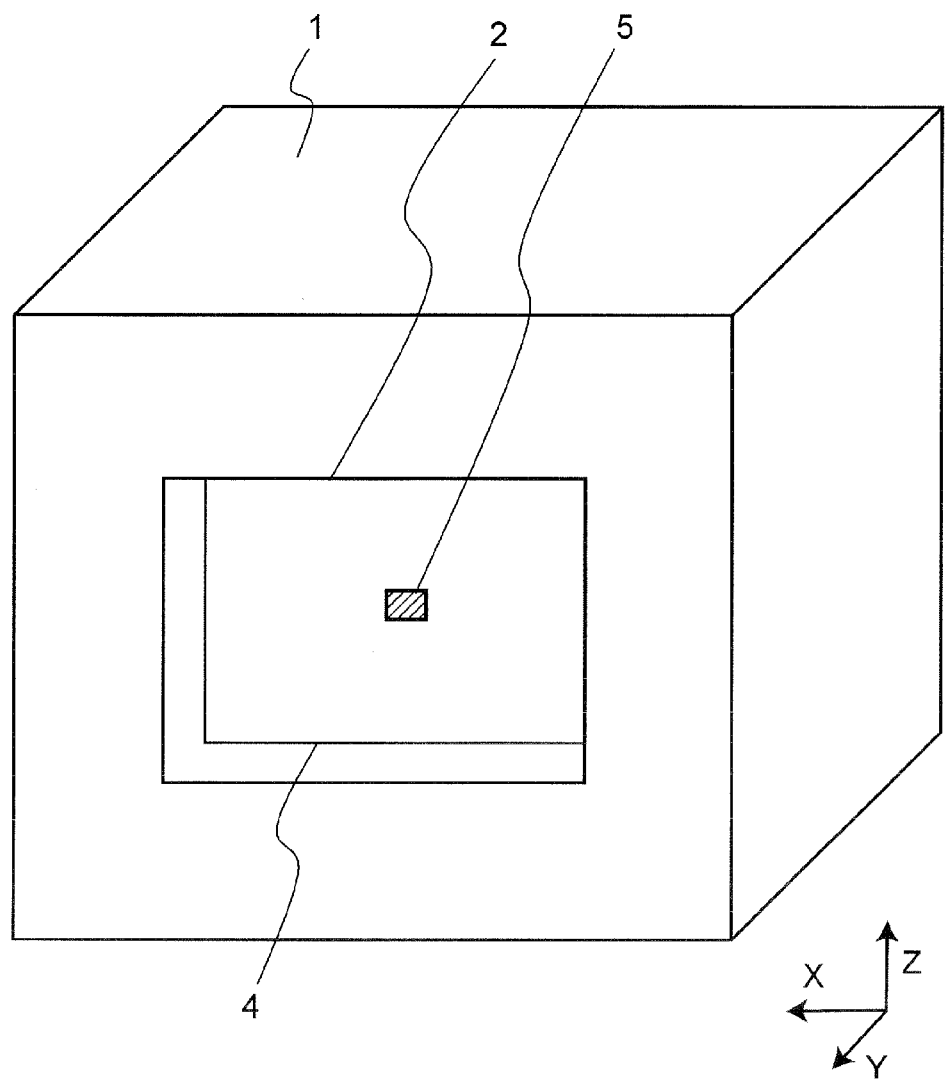
FIG. 2 is a perspective view showing a configuration of a radome according to a first comparison example, with conductor portions of the electromagnetic wave filter apparatus 3 of FIG. 1 removed.
Figure 3:
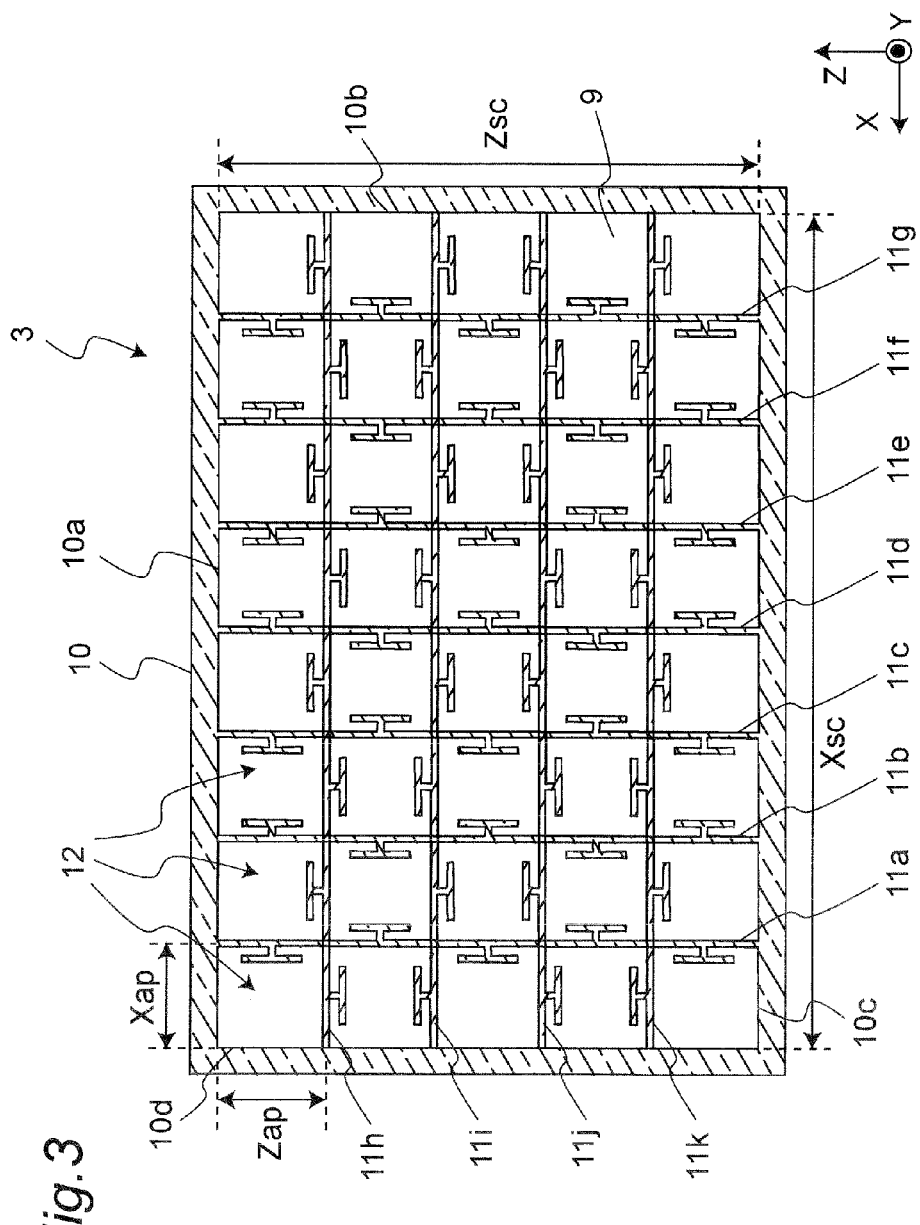
FIG. 3 is a top view showing a detailed configuration of the electromagnetic wave filter apparatus 3 of FIG. 1.
Figure 4:
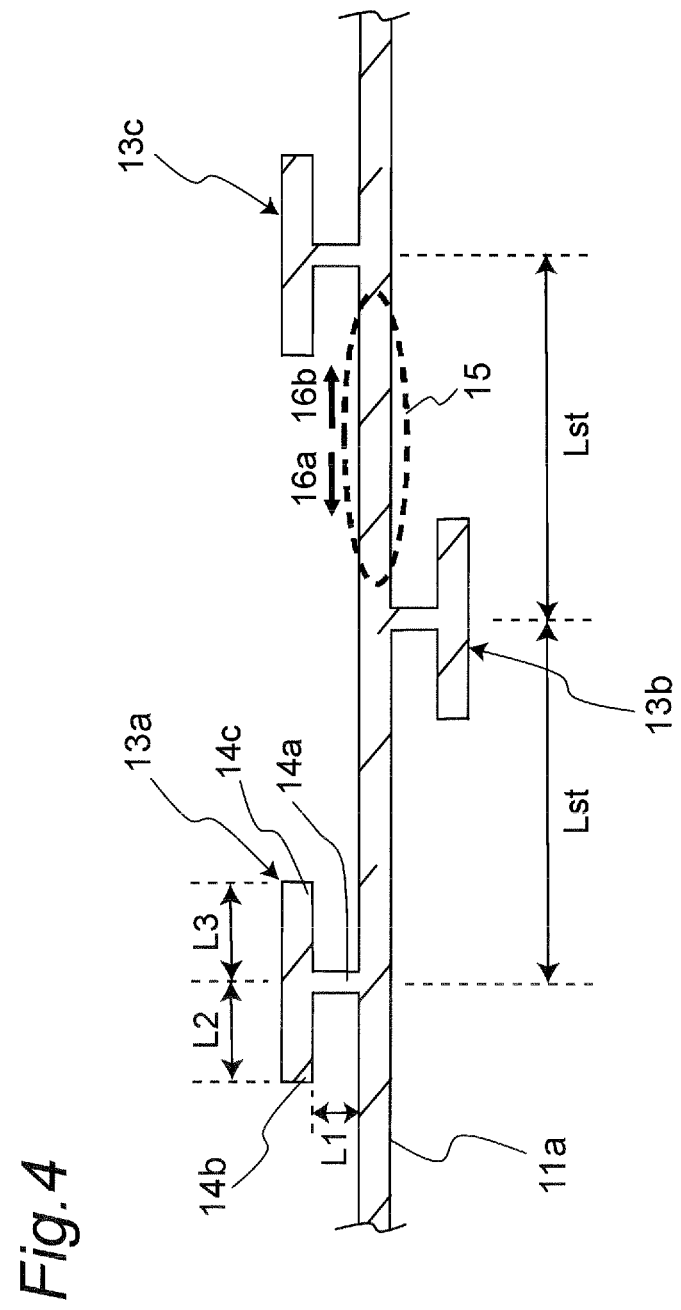
FIG. 4 is a partial enlarged view showing a detailed configuration of a strip conductor 11a of FIG. 3.
Figure 5:
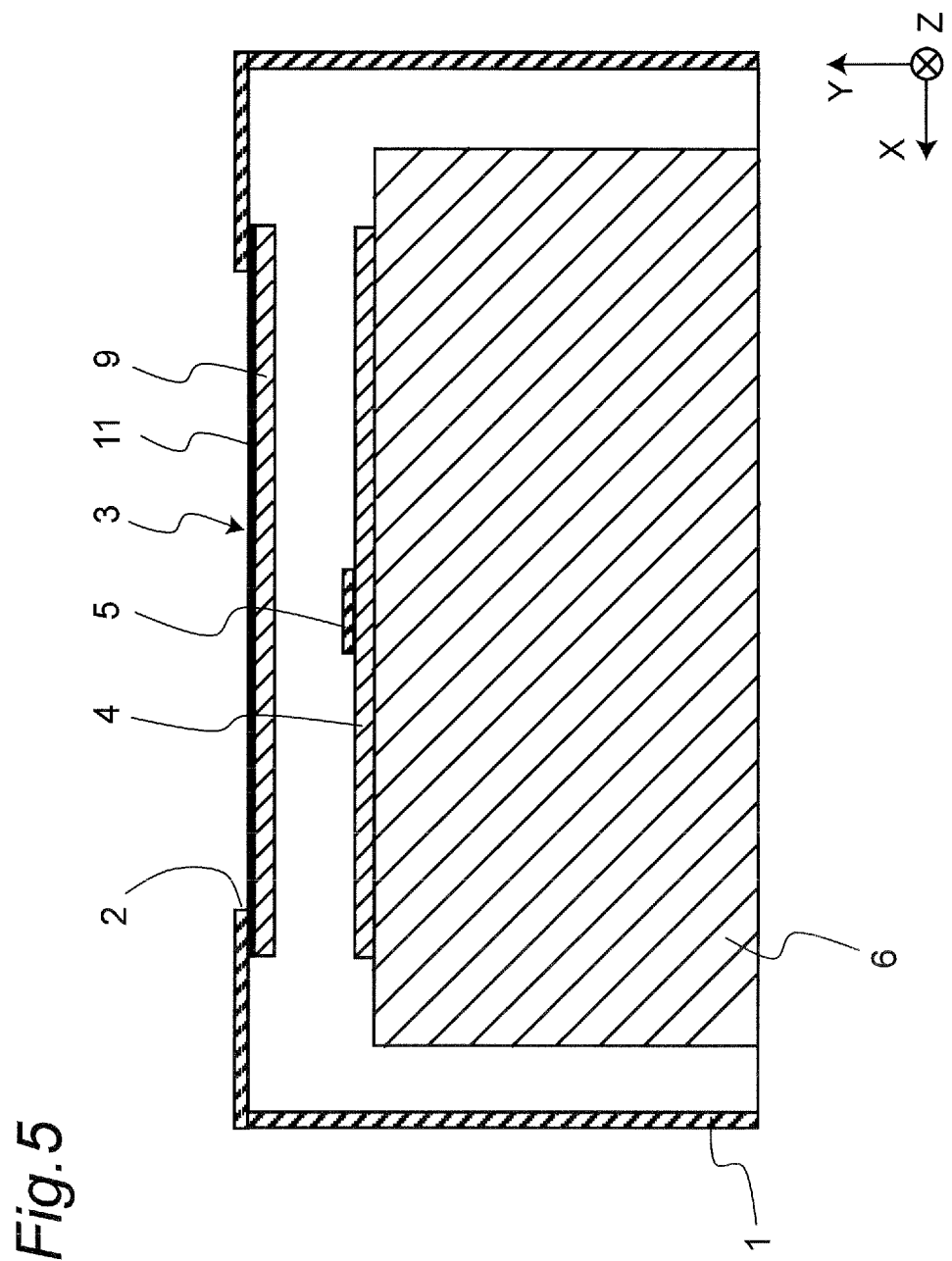
FIG. 5 is a cross-sectional view at line A-A' of FIG. 1 in a −Y direction.

FIG. 1 is a perspective view showing a configuration of a radome with an electromagnetic wave filter apparatus 3 according to an embodiment of the present invention, and FIG. 2 is a perspective view showing a configuration of a radome according to a first comparison example, with removal of conductor portions of the electromagnetic wave filter apparatus 3 of FIG. 1. In addition, FIG. 3 is a top view (conductor pattern diagram) showing a detailed configuration of the electromagnetic wave filter apparatus 3 of FIG. 1, FIG. 4 is a partial enlarged view showing a detailed configuration of a strip conductor 11a of FIG. 3, and FIG. 5 is a cross-sectional view at line A-A' of FIG. 1 in a -Y direction. In FIG. 1, a grounded shield conductor 1 is provided so as to enclose an antenna substrate 4 including an antenna element 5 (as shown in FIG. 5, the antenna substrate 4 is preferably provided on a dielectric support 6). The shield conductor 1 electromagnetically blocks electronic equipment contained therein from outer space, and vice versa. In addition, the shield conductor 1 has a shield aperture 2 which is made by removing the conductor at a part of the structure of the shield conductor 1 so as to be open in a radiation direction of the antenna element 5. With reference to FIG. 2, the antenna substrate 4 and the antenna element 5 positioned within the shield conductor 1 can be seen through the shield aperture 2. The antenna element 5 is, for example, a patch antenna. In this specification, an example of electromagnetic waves radiated from the antenna element 5 and having vertical polarization will be described below. In the embodiment of the present invention, an electromagnetic wave filter apparatus 3 is further provided in the entire area of the shield aperture 2, as shown in FIG. 1.

With reference to FIG. 3, the electromagnetic wave filter apparatus 3 is configured to include: a dielectric substrate 9 having a sufficient size to cover the shield aperture 2 (see FIG. 5); a ground conductor 10 patterned in an annular shape on the dielectric substrate 9 so as to fit an edge of the shield aperture 2 (i.e., an inner edge); and strip conductors 11a to 11k (hereinafter, collectively referred to as "11") patterned on the dielectric substrate 9, inside the inner edge of the ground conductor 10, for blocking electromagnetic waves with low frequencies fL. In the present embodiment, the shield aperture 2 is rectangular, and accordingly, the inner edge of the ground conductor 10 is also a rectangle with sides 10a, 10b, 10c, and 10d. The strip conductors 11a to 11k are patterned on the dielectric substrate 9, inside the inner edge of the ground conductor 10, so as to electrically connect opposing portions of the ground conductor 10 with each other. Specifically, the strip conductors 11a to 11g are formed to extend in a Z-axis direction and to be provided at intervals in an X-axis direction, and to electrically connect the opposing sides 10a and 10c of the ground conductor 10. The strip conductors 11h to 11k are formed to extend in the X-axis direction and to be provided at intervals in the Z-axis direction, and to electrically connect the opposing sides 10b and 10d of the ground conductor 10. In the present embodiment, the conductor portions of the electromagnetic wave filter apparatus 3 (i.e., the ground conductor 10 and the strip conductors 11, and stub conductors 13 which will be described later) are all formed on a +Y side surface of the dielectric substrate 9 (see FIG. 5). The strip conductors 11a to 11g and the strip conductors 11h to 11k intersect each other and are electrically connected to each other. The ground conductor 10 is electrically connected to the shield conductor 1 at the edge of the shield aperture 2. Thus, the ground conductor 10 is actually grounded through the shield conductor 1, and the strip conductors 11a to 11k divide the shield aperture 2 into a plurality of small apertures 12. The shield aperture 2 and the inner edge of the ground conductor 10 have a length Xsc in the X-axis direction and a length Zsc in the Z-axis direction. Each aperture 12 has a length Xap in the X-axis direction and a length Zap in the Z-axis direction.

In the embodiment of the present invention, each of the strip conductors 11a to 11k is characterized by including a plurality of stub conductors 13a, 13b, 13c, . . . (hereinafter, collectively referred to as "13"), as shown in FIG. 4. Each stub conductor 13 is configured as an open circuited stub, and operates as a bandstop filter for blocking a band including a certain predetermined frequency fp. In each strip conductor 11, adjacent stub conductors 13 are provided with a certain distance Lst therebetween. FIG. 4 schematically shows only the stub conductors 13a, 13b, and 13c provided on the strip conductor 11a. For ease of illustration, the strip conductors 11h to 11k intersecting the strip conductor 11a are omitted. An open circuited stub structure is of a common radio frequency circuit using a principle that only those components of electromagnetic waves near the frequency fp passing through a main line (i.e., the strip conductor 11a) are blocked, on condition that the effective length of an open-ended branch line attached to the main line corresponds to one-quarter wavelength at the frequency fp.

Now, the operating principles of the stub conductors 13 will be described. As indicated by arrows in FIG. 4, there are two paths 16a and 16b as paths along the strip conductor 11a from an arbitrary region 15 on the strip conductor 11a to the sides 10a and 10c of the inner edge of the ground conductor 10. When an electromagnetic wave with the frequency fp passes through the space surrounding the region 15, a charge appears in the region 15 due to the interaction between the passing electromagnetic wave and the strip conductor 11a, and the charge will inherently flow through the paths 16a and 16b to the ground conductor 10. In the configuration of the present embodiment, since the stub conductor 13b is inserted on the side of the path 16a and the stub conductor 13c is inserted on the side of the path 16b as well, the radio frequency current with the frequency fp appearing in the region 15 when the electromagnetic wave with the frequency fp passes through near the region 15 is blocked by the stub conductors 13b and 13c, and thus, no radio frequency current flows from the region 15 to the ground conductor 10. Accordingly, even if the electromagnetic wave with the frequency fp passes through the space surrounding the region 15, the interaction between the strip conductor 11a and the passing electromagnetic wave is suppressed. By providing a plurality of stub conductors 13 such that they are distributed along the strip conductors 11, it is possible to provide, widely over the strip conductors 11, regions through which the radio frequency current with the frequency fp can not flow. As shown in FIG. 3, even when the strip conductors 11a to 11g parallel to the Z-axis direction and the strip conductors 11h to 11k parallel to the X-axis direction intersect each other and are electrically connected to each other, and thus when there are three or more paths from a region on the strip conductor 11 to the ground conductor 10, it is also possible to provide over the strip conductors 11 regions through which the radio frequency current with the frequency fp can not flow, by inserting in all the paths the stub conductors 13 operable as bandstop filters. In this case, if the radio frequency current with the frequency fp is prevented from flowing over all regions on the strip conductors 11 of the electromagnetic wave filter apparatus 3, then the electromagnetic waves passing through the electromagnetic wave filter apparatus 3 in the Y directions can not interact with the strip conductors 11 at all.

Accordingly, in the embodiment of the present invention, since the strip conductors 11 do not resonate at a certain frequency because of the presence of the stub conductors 13 provided on the respective strip conductors 11, the electromagnetic waves with the frequency can freely pass through the electromagnetic wave filter apparatus.

Figure 12:
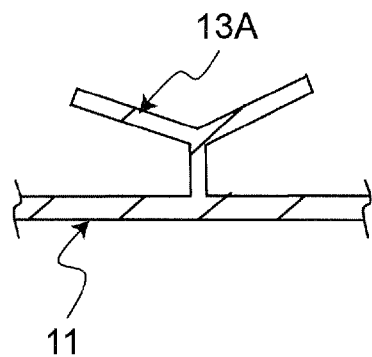
FIG. 12 is a partial enlarged view showing a configuration of a stub conductor 13A according to a modified embodiment of stub conductors 13 of FIG. 4.
Figure 13:
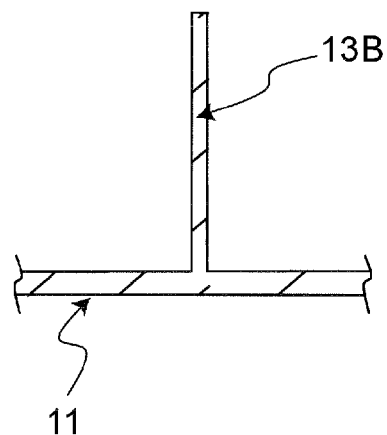
FIG. 13 is a partial enlarged view showing a configuration of a stub conductor 13B according to a modified embodiment of the stub conductors 13 of FIG. 4.
Figure 14:
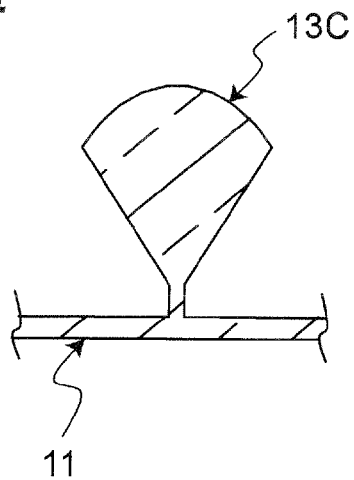
FIG. 14 is a partial enlarged view showing a configuration of a stub conductor 13C according to a modified embodiment of the stub conductors 13 of FIG. 4.
Figure 15:
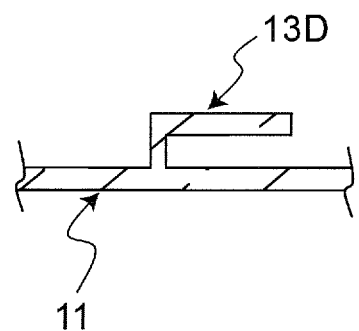
FIG. 15 is a partial enlarged view showing a configuration of a stub conductor 13D according to a modified embodiment of the stub conductors 13 of FIG. 4.
Figure 16:
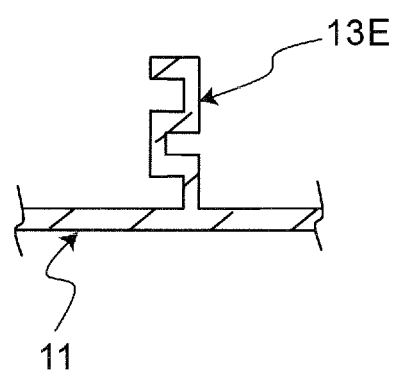
FIG. 16 is a partial enlarged view showing a configuration of a stub conductor 13E according to a modified embodiment of the stub conductors 13 of FIG. 4.

If the stub conductors 13 themselves can emit radiation, it may result in degrading the suppression effect on current components flowing through the strip conductors 11. Accordingly, each stub conductor 13 is preferably symmetrical so as to cancel out radiation components of that stub conductor 13. In particular, each stub conductor 13 is preferably configured in T-shape as shown in FIG. 4. Specifically, the stub conductor 13a is preferably configured to include a conductor portion 14a with a length L1 which is branched off from the strip conductor 11a, and conductor portions 14b and 14c with lengths L2 and L3 which are further branched off from a tip of the conductor portion 14a and which are configured with an equal line width and an equal length to each other. The conductor portions 14b and 14c are preferably configured to be mirror symmetric with respect to a plane including the conductor portion 14a. In particular, each stub conductor 13 is preferably configured to be mirror symmetric with respect to a plane perpendicular to a longitudinal direction of a corresponding strip conductor 11 in a position in which the stub conductor 13 is connected to the corresponding strip conductor 11. Further, even when each stub conductor 13 is configured in a Y-shape as shown in FIG. 12, the same effect can be obtained.

In addition, as a first distribution condition for the stub conductors 13, on each strip conductor 11, the stub conductors 13 are preferably connected along the longitudinal direction of the strip conductor 11, and alternately connected in a first and a second direction opposite to each other, as shown in FIGS. 3 and 4. In other words, it is preferred that in each strip conductor 11, the adjacent stub conductors 13 are alternately branched off from the strip conductor 11 in opposite directions. In addition, as a second distribution condition for the stub conductors 13, on any two adjacent ones of the parallel strip conductors 11, preferably, one of each pair of stub conductors 13 close to each other between the strip conductors 11 is connected in the first direction and the other stub conductor 13 is connected in the second direction, as shown in FIG. 3. In other words, it is preferred that each pair of stub conductors 13 close to each other between strip conductors 11 be configured not in the same direction, but opposed to each other (note that due to the first distribution condition, every other pair of stub conductors 13 are opposed to each other on a certain pair of strip conductors 11). Through these distribution conditions for the stub conductors 13, it is possible to cancel out undesired components radiated from the stub conductors 13 themselves. Thus, even if the stub conductors 13 themselves emit radiation, it is possible to effectively suppress undesired influence on radiation characteristics at a certain frequency.

In addition, the effective distance between adjacent stub conductors 13 on each strip conductor 11 is preferably designed not to be an N/2 wavelength, where N is an integer. When both ends of a region 15 are open-circuited and the effective line length is an N/2 wavelength, there is a risk that the strip conductor 11 itself may operate as an antenna and emit radiation. Hence, the effective distance between adjacent stub conductors 13 is preferably configured not to be an N/2 wavelength, and is more preferably configured to be less than an N/2 wavelength.

Now, with reference to FIGS. 2 and 17 to 20, the configurations and operations of prior art electromagnetic wave filter apparatuses will be described as comparison examples for the embodiment of the present invention. FIG. 2 shows a first comparison example for the embodiment of the present invention, and shows a radome according to prior art without the conductor portions of the electromagnetic wave filter apparatus 3 as the characterizing features of the embodiment of the present invention (i.e., provided with only a dielectric substrate 9 and without conductor portions such as strip conductors 11). In the first comparison example, it does not suppress the intensity of undesired electromagnetic waves in a low frequency band passing through an electromagnetic wave filter apparatus 3, and accordingly, it does not achieve the second object of the present invention, i.e., to improve the blocking characteristics of low-frequency noise components.

Figure 17:
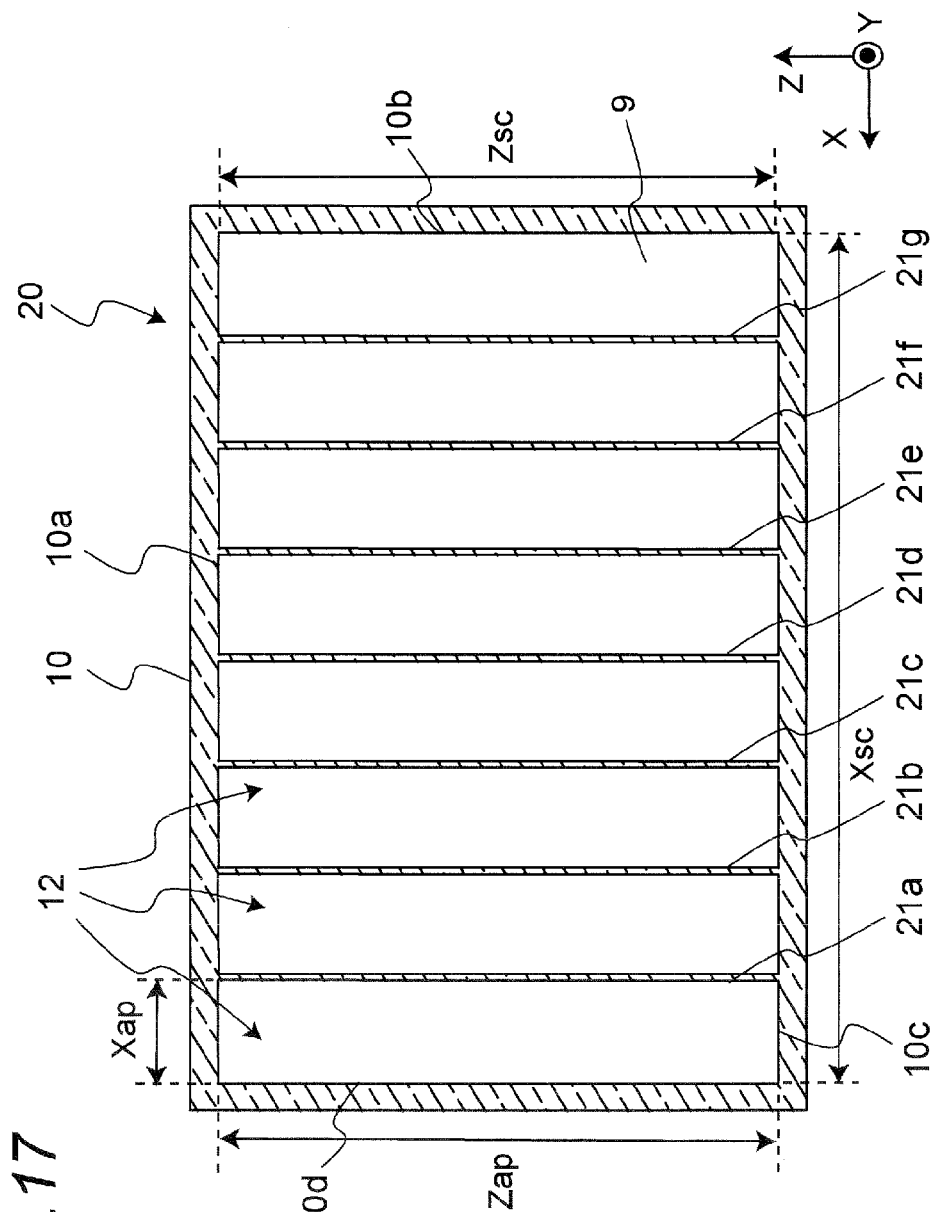
FIG. 17 is a top view showing a configuration of an electromagnetic wave filter apparatus 20 according to a second comparison example.
Figure 18:
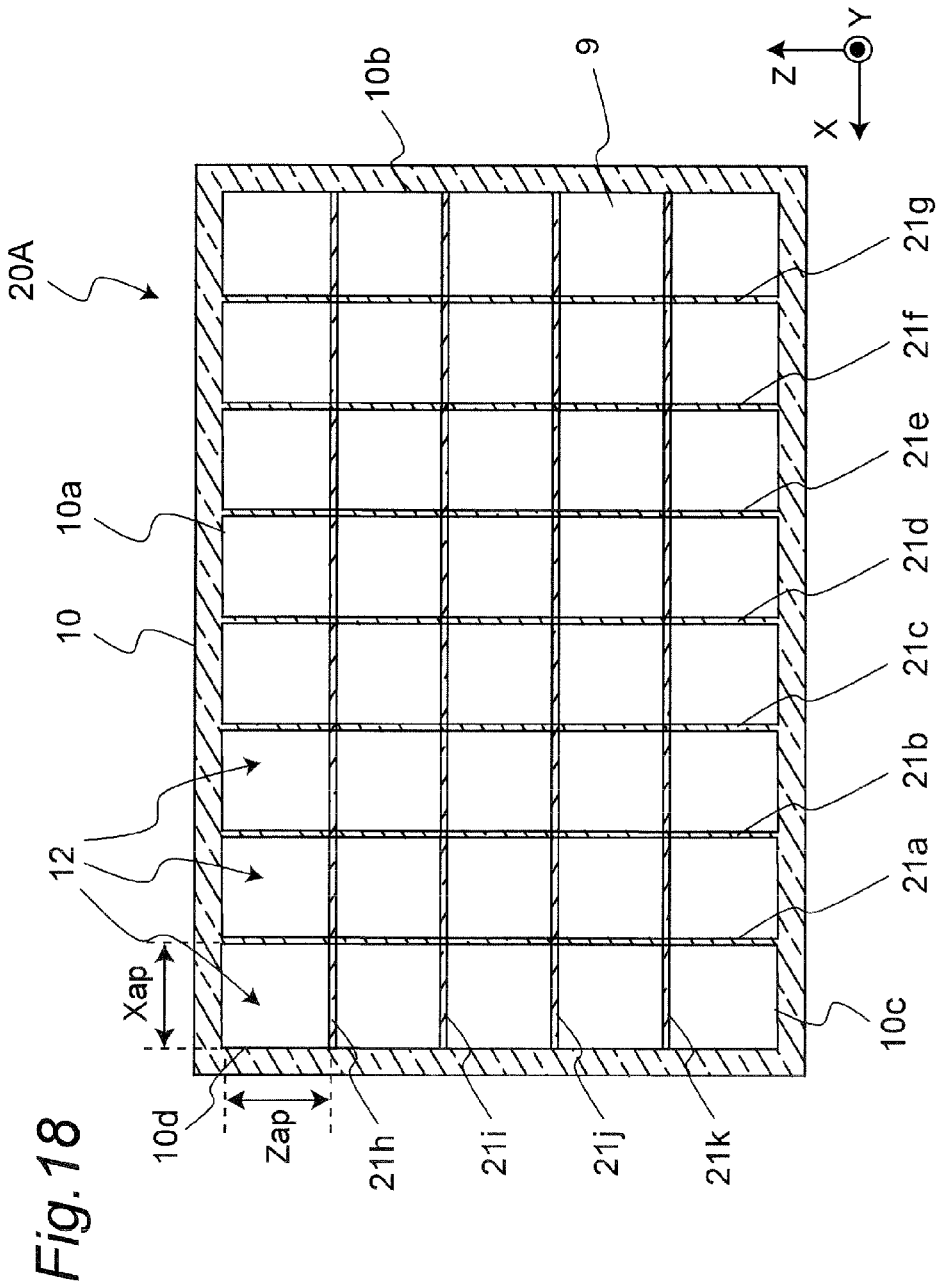
FIG. 18 is a top view showing a configuration of an electromagnetic wave filter apparatus 20A according to a third comparison example.

FIG. 17 is a top view showing a configuration of an electromagnetic wave filter apparatus 20 according to a second comparison example, and FIG. 18 is a top view showing a configuration of an electromagnetic wave filter apparatus 20A according to a third comparison example. The second comparison example is a prior art radome configured by adding the first comparison example with the electromagnetic wave filter apparatus 20 of FIG. 17. With reference to FIG. 17, the electromagnetic wave filter apparatus 20 is configured to include the same dielectric substrate 9 and ground conductor 10 as those of the electromagnetic wave filter apparatus 3 of FIG. 3, and further include strip conductors 21a to 21 g patterned on the dielectric substrate 9, inside an inner edge of the ground conductor 10, without bandstop filters (i.e., stub conductors 13). The strip conductors 21a to 21g are patterned on the dielectric substrate 9 to extend in the Z-axis direction and to be provided at intervals in the X-axis direction, and to electrically connect opposing sides 10a and 10c of the ground conductor 10. Thus, the strip conductors 21a to 21g divide a shield aperture 2 of FIG. 2 into a plurality of small apertures 12. Accordingly, the length Xap in the X-axis direction of each aperture 12 is shorter than the length Xsc in the X-axis direction of the shield aperture 2, thus obtaining a shielding effect for radiated electromagnetic waves with vertical polarization. In this configuration, the length Zap in the Z-axis direction of each aperture 12 is the same as the length Zsc in the Z-axis direction of the shield aperture 2. That is, in the second comparison example, the shield aperture 2 with a wide area is replaced by a set of the apertures 12 each with a narrow area, thus obtaining a shielding effect for electromagnetic waves in a low frequency band passing through the electromagnetic wave filter apparatus 20, and achieving the second object of the present invention, i.e., to improve the blocking characteristics of low-frequency noise components.

If the polarization components of noise electromagnetic waves to be suppressed also include horizontal polarization components, it is necessary to obtain a shielding effect not only for radiated electromagnetic waves with vertical polarization, but also for radiated electromagnetic waves with horizontal polarization. The third comparison example shown in FIG. 18 is a prior art radome configured by adding the configuration of the second comparison example with strip conductors 21h to 21k without bandstop filters (i.e., stub conductors 13). The strip conductors 21h to 21k are patterned on a dielectric substrate 9 to extend in the X-axis direction and to be provided at intervals in the Z-axis direction, and to electrically connect opposing sides 10b and 10d of a ground conductor 10. Thus, the strip conductors 21a to 21k (hereinafter, collectively referred to as "21") divide a shield aperture 2 of FIG. 2 into a plurality of small apertures 12. In order to obtain a shielding effect for radiated electromagnetic waves with both vertical polarization and horizontal polarization, it is effective to add the configuration of the electromagnetic wave filter apparatus 20 of FIG. 17 with the strip conductors 21h to 21k extending in the X-axis direction, thus reducing the lengths Zap in the Z-axis direction of the respective apertures 12, as shown in FIG. 18. The shield aperture 2 with a wide area is replaced by a set of the apertures 12 each with a narrow area, thus obtaining the second object of the present invention, i.e., to improve the blocking characteristics of low-frequency noise components.

However, in the second and third comparison examples, when an electromagnetic wave with a certain frequency passes through the electromagnetic wave filter apparatus 20, 20A, the interaction between the passing electromagnetic wave and the strip conductors 21 is unavoidable. If a charge appears on the strip conductors 21 due to the interaction, then the charge flows to the edges of the electromagnetic wave filter apparatus 20, 20A, i.e., short-circuit points among the strip conductors 21, and the ground conductor 10 and the shield conductor 1. If radiation resulting from the distribution of currents flowing through the strip conductors 21 is superposed, then it changes the original radiation characteristics of an antenna element 5 shielded by the electromagnetic wave filter apparatus 20, 20A. Hence, even if using the configurations of the second and third comparison examples, it is not possible to achieve the first object of the present invention, i.e., to ensure the radiation characteristics of electromagnetic waves with a certain frequency fp.

Figure 19:
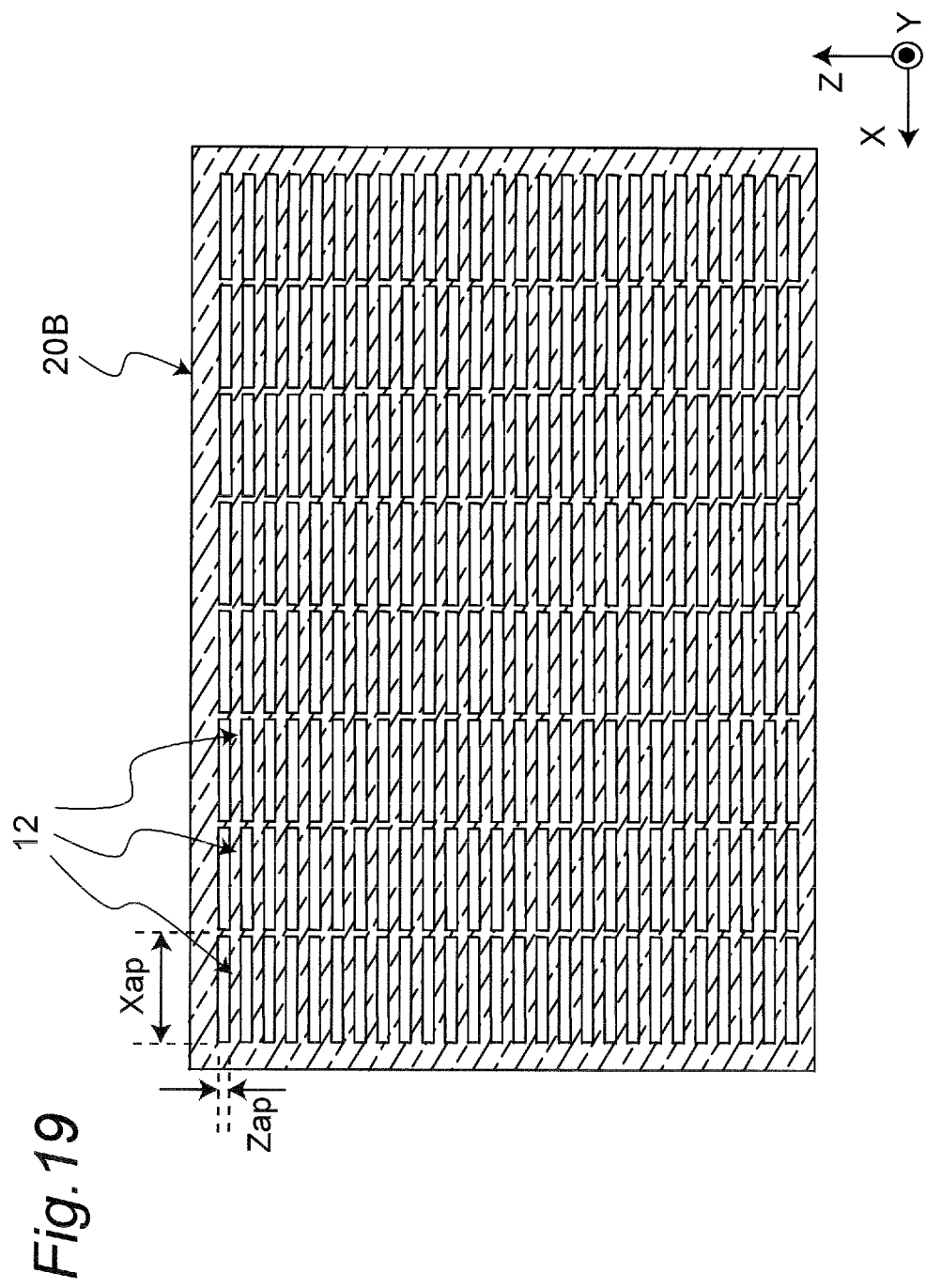
FIG. 19 is a top view showing a configuration of an electromagnetic wave filter apparatus 20B according to a fourth comparison example.

FIG. 19 is a top view showing a configuration of an electromagnetic wave filter apparatus 20B according to a fourth comparison example, and FIG. 20 is a top view showing a configuration of an electromagnetic wave filter apparatus 20C according to a fifth comparison example. The fourth and fifth comparison examples are prior art radomes configured by adding the first comparison example with the electromagnetic wave filter apparatuses 20B and 20C corresponding to the disclosures of Patent Literatures 1 to 3. With reference to FIG. 19, the electromagnetic wave filter apparatus 20B includes a plurality of slot apertures 12 patterned on a conductor surface on a dielectric substrate 9. Each aperture 12 has an edge with a length corresponding to one wavelength at a certain frequency fp so that the aperture 12 resonates as a slot antenna at the frequency fp. In this specification, each aperture 12 of the electromagnetic wave filter apparatus 20B is described as a rectangular slot having a length Xap in the X-axis direction and a length Zap in the Z-axis direction. As similar to the case of the strip conductors 21 of the second and third comparison examples, also in the fourth comparison example, it is unavoidable that a radio frequency current with the frequency fp flows through the conductor portions of the electromagnetic wave filter apparatus 20B. Hence, even if using the configuration of the fourth comparison example, it is not possible to achieve the first object of the present invention, i.e., to ensure the radiation characteristics of electromagnetic waves with the frequency fp. With reference to FIG. 20, in the fifth comparison example as a modified embodiment for the fourth comparison example, apertures 12 are configured such that apertures 12 adjacent in the Z-axis direction are offset from each other by a length Xos in the X-axis direction. By changing the relative positions between the apertures 12, the influence on the radiation pattern of passing electromagnetic waves changes. However, again, also in the configuration of the fifth comparison example, it is unavoidable that a radio frequency current with the frequency fp flows through the conductor portions of the electromagnetic wave filter apparatus 20C, and thus, it is not possible to achieve the first object, i.e., to ensure the radiation characteristics of electromagnetic waves with the frequency fp.

On the other hand, in the electromagnetic wave filter apparatus 3 according to the embodiment of the present invention, a plurality of stub conductors 13 operable as bandstop filters are provided on each strip conductor 11 as described above, thus achieving both the first and second objects, i.e., to ensure the radiation characteristics of electromagnetic waves with a certain frequency fp, and to improve the blocking characteristics of low-frequency noise components.

A phenomenon as observed in the embodiment of the present invention, in which space inhibiting the presence of electromagnetic waves with specific energy appears, has similarities to a so-called photonic band structure for controlling electromagnetic waves. According to the prior art, it is possible to control the possible energy state for an electromagnetic wave traveling through a space, by using a dielectric having a periodic structure. Note that the prior art photonic band technique is used to change radiation characteristics from an electromagnetic emission source, such as an antenna or fluorescent material. On the other hand, the present invention provides a structure for preventing a change in radiation characteristics from an electromagnetic emission structure such as an antenna. In terms of this point, it can be said that the present invention is operable based on principles significantly different from those of the prior art. In addition, according to a typical example of radiating electromagnetic waves using the photonic band structure, irregularities in a radiation direction are often introduced into a periodic structure. That is, in this example, a structure with a periodical change in permittivity is formed around a radiation source, and then, the periodicity is reduced in a radiation direction so as to efficiently emit electromagnetic wave energy in one direction. In other words, an electromagnetic wave reflection structure made of a periodic structure is provided so as to suppress radiation in directions other than the direction in which energy is to be emitted. On the other hand, according to the structure of the present invention, a conductor structure designed to control the energy states of electromagnetic waves is provided across a direction in which the electromagnetic waves pass through. This is because the present invention is configured to selectively inhibit the energy for electromagnetic waves flowing through the strip conductors 11 as currents, not for electromagnetic waves traveling through a space. Thus, according to the configuration of the present invention, it is possible to achieve the first object, i.e., to ensure the radiation characteristics of electromagnetic waves with a certain frequency fp, by means of an electromagnetic wave energy control method different from those of the prior art.

According to the embodiment of the present invention, the apertures 12 do not need to be designed to resonate at the frequency fp. According to the fourth and fifth comparison examples, the apertures 12 operate as slot antennas at the frequency fp, and radio frequency currents flow through the edges of the apertures 12, i.e., the conductor portions of the electromagnetic wave filter apparatus 20B, 20C. Thus, according to the fourth and fifth comparison examples, the edge length of each aperture 12 needs to be a slot resonator length (e.g., one effective wavelength). On the other hand, according to the present invention, no radio frequency current flows through strip conductors 11 around each aperture 12. Thus, the edge length of each aperture 12 in the embodiment of the present invention does not depend on the wavelength of electromagnetic waves to be transmitted and received, and thus, it is possible to configure apertures far smaller than those of the prior art. By configuring the apertures 12 in the embodiment of the present invention to be smaller than the apertures 12 in the fourth and fifth comparison examples, it is possible to significantly improve the blocking characteristics of electromagnetic waves with low frequencies fL possibly passing through the electromagnetic wave filter apparatus 3.

With reference to an exemplary configuration of FIG. 1 of Patent Literature 3, a conductor as an outer edge of each aperture is connected with a pair of opposing branch lines to configure a filter. However, according to Patent Literature 3, since a radio frequency current with a certain frequency fp flows through the conductor, it can be seen that the branch lines of Patent Literature 3 are significantly different from the stub conductors 13 in the embodiment of the present invention. The exemplary configuration of Patent Literature 3 is a mere configuration for short-circuiting the conductor so that a radio frequency current with a frequency fH higher than the frequency fp flows through a distributed capacitance between the pair of branch lines. On the other hand, the stub conductors 13 in the embodiment of the present invention are conditioned so that their stub length corresponds to one-quarter effective wavelength at the frequency fp, and thus, have no connection with Patent Literature 3 in terms of their configuration and effect. However, the stub conductors 13 of the present invention can also be designed such that a sufficient capacitance at a frequency fH higher than the frequency fp is provided between the respective tips of a pair of opposing stub conductors 13 between adjacent strip conductors 11, thus flowing a radio frequency current with the frequency fH through the pair of stub conductors 13, and obtaining an effect that the electromagnetic wave filter apparatus 3 can block electromagnetic waves with the frequency fH.

Several modified embodiments according to the embodiment of the present invention will be described below.

Figure 6:
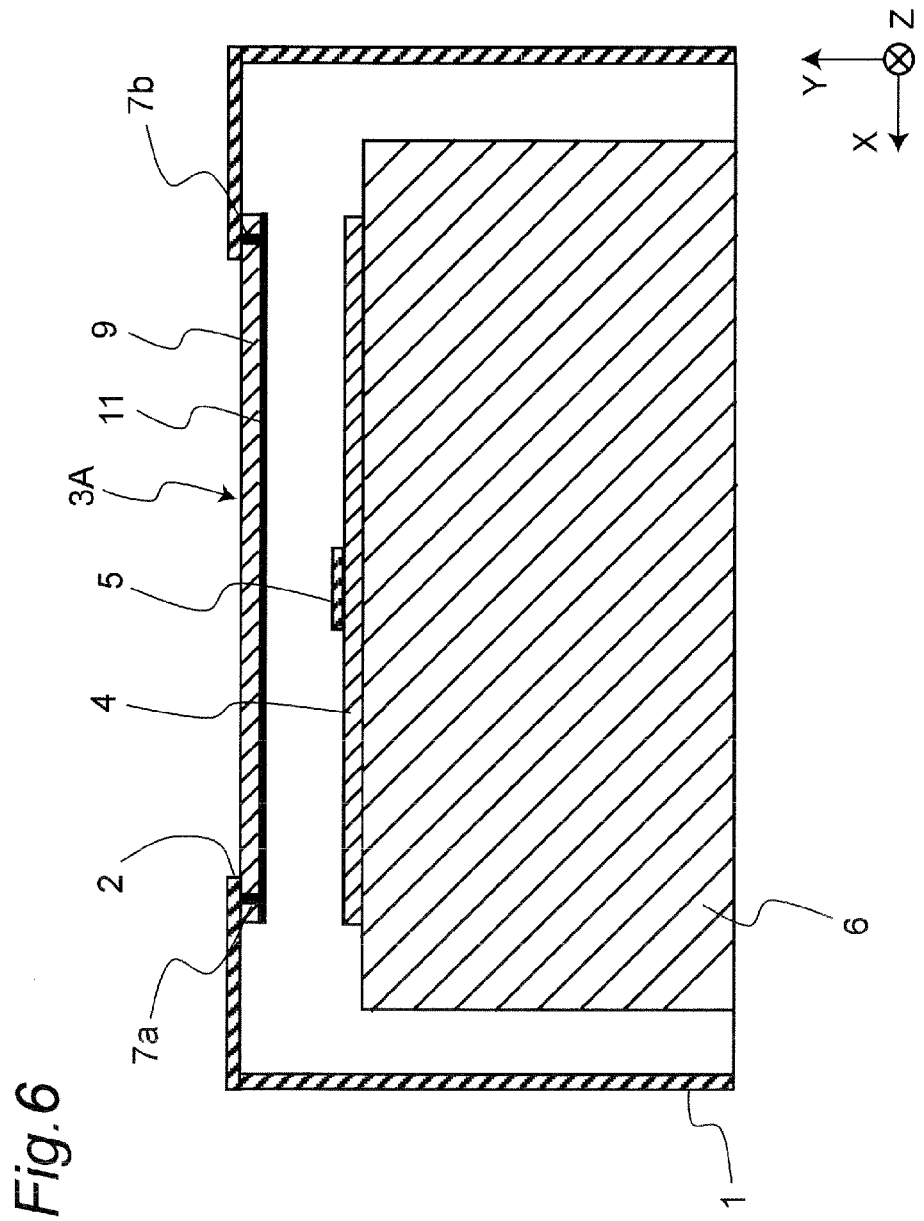
FIG. 6 is a cross-sectional view showing a configuration of a radome with an electromagnetic wave filter apparatus 3A according to a first modified embodiment of the embodiment of the present invention.

FIG. 6 is a cross-sectional view showing a configuration of a radome with an electromagnetic wave filter apparatus 3A according to a first modified embodiment of the embodiment of the present invention. The conductor portions of the electromagnetic wave filter apparatus are not limited to be formed on a +Y side surface of the dielectric substrate 9 (i.e., the outer side of the radome) as shown in FIG. 5, and may be formed on a −Y side surface (i.e., the inner side of the radome) as shown in FIG. 6. In the present modified embodiment, a plurality of via conductors are provided along the inner edge of the ground conductor 10 (not shown in FIG. 6) at intervals, so as to penetrate through the dielectric substrate 9 at the position of the ground conductor 10, thus electrically connecting the conductor portions of the electromagnetic wave filter apparatus 3A to the shield conductor 1. FIG. 6 shows only via conductors 7a and 7b (hereinafter, collectively referred to as "7"). One end of each via conductor 7 is electrically connected to the ground conductor 10 at the −Y side surface of the dielectric substrate 9, and the other end is electrically connected to the shield conductor 1 at the +Y side surface. The configuration of the present modified embodiment is desired, because strip conductors 11 and stub conductors 13 are not exposed outside the radome.

Figure 7:
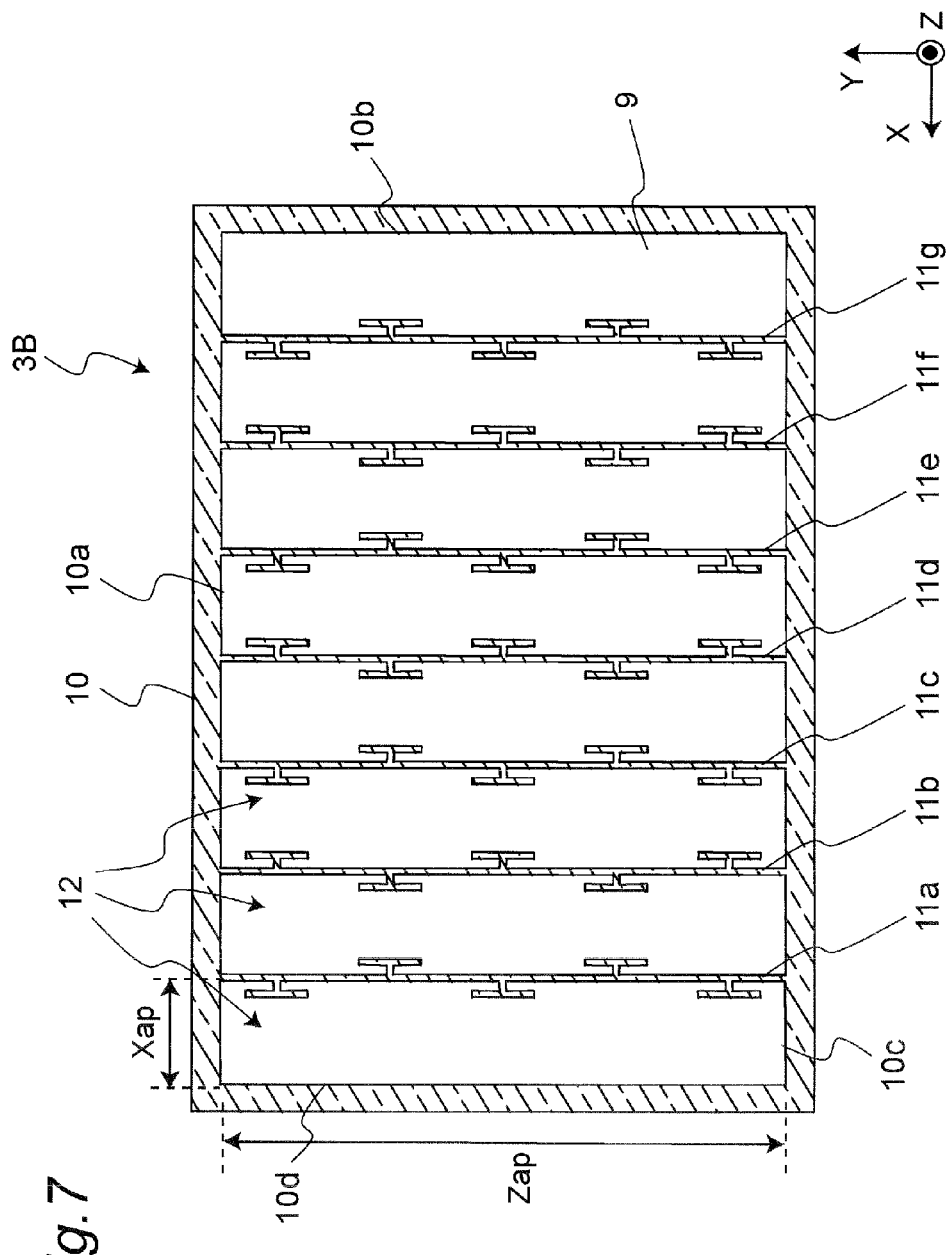
FIG. 7 is a top view showing a configuration of an electromagnetic wave filter apparatus 3B according to a second modified embodiment of the embodiment of the present invention.

FIG. 7 is a top view showing a configuration of an electromagnetic wave filter apparatus 3B according to a second modified embodiment of the embodiment of the present invention. The strip conductors 11 are not limited to include both the ones parallel to the X-axis direction and the ones parallel to the Z-axis direction as shown in FIG. 3, and only either ones may be provided according to the polarization characteristics of electromagnetic waves to be transmitted and received. In the configuration of FIG. 7, the strip conductors 11a to 11g are patterned on the dielectric substrate 9 to extend in the Z-axis direction and to be provided at intervals in the X-axis direction, and to electrically connect the opposing sides 10a and 10c of the ground conductor 10. Thus, the strip conductors 11a to 11g divide the shield aperture 2 into a plurality of small apertures 12. Accordingly, the length Xap in the X-axis direction of each aperture 12 is shorter than the length Xsc in the X-axis direction of the shield aperture 2, thus obtaining a shielding effect for radiated electromagnetic waves with vertical polarization.

Figure 8:
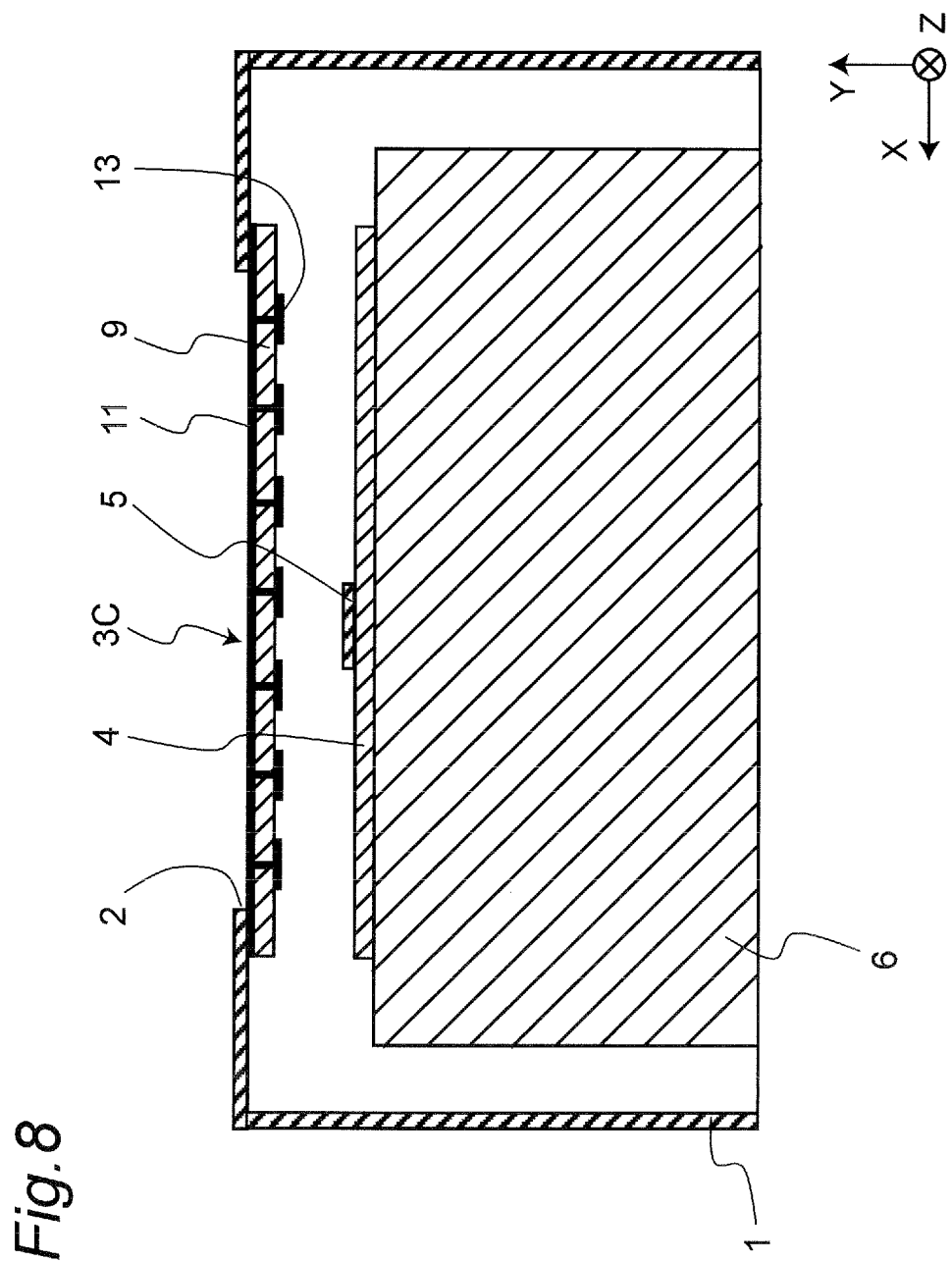
FIG. 8 is a cross-sectional view showing a configuration of a radome with an electromagnetic wave filter apparatus 3C according to a third modified embodiment of the embodiment of the present invention.

FIG. 8 is a cross-sectional view showing a configuration of a radome with an electromagnetic wave filter apparatus 3C according to a third modified embodiment of the embodiment of the present invention. The stub conductors 13 are not limited to be formed on the same plane as a plane where the strip conductors 11 are formed. By using typical techniques for manufacturing multilayer printed wiring boards, for example, it is easily possible to align part of the conductor portions of each stub conductor 13 in a third direction perpendicular to a plane where strip conductors 11 are formed.

With reference to FIG. 8, in the electromagnetic wave filter apparatus 3C of the present modified embodiment, the respective stub conductors 13 are formed to be positioned on the −Y side relative to the strip conductors 11 to which the stub conductors 13 are connected. Specifically, the dielectric substrate 9 is made as a double-sided printed wiring board. The strip conductors 11 are patterned on the conductor surface on the +Y side of the dielectric substrate 9. Each portion corresponding to the conductor portion 14a of FIG. 4 is made of a via conductor, which is branched off from a strip conductor 11 and penetrates through the dielectric substrate 9. Portions corresponding to the conductor portions 14b and 14c of FIG. 4 are patterned on a conductor surface on the −Y side of the dielectric substrate 9 and are electrically connected to each via conductor. According to a typical exemplary configuration of the embodiment of the present invention, the electromagnetic wave filter apparatus is provided perpendicular to a traveling direction of the passing electromagnetic waves. Thus, the alignment direction of the stub conductors 13 of the present modified embodiment has components parallel to the traveling direction of the passing electromagnetic waves. While the strip conductors 11 formed in the plane perpendicular to electromagnetic waves passing through the electromagnetic wave filter apparatus 3C are apt to interact with the passing electromagnetic waves due to their perpendicularity, the stub conductors 13 have more difficulty in interacting with passing electromagnetic waves as the stub conductors 13 become more parallel to the passing electromagnetic waves. Hence, according to the configuration of the present modified embodiment, at least a part of conductor portions in the configuration of each stub conductor 13 is preferably aligned in a direction with a component parallel to the passing electromagnetic waves. In any case, it is possible to select the configuration of the stub conductors 13 taking into account not only radio frequency characteristics, but also values such as manufacturing costs, occupied capacity, and variations in characteristics.

Figure 9:
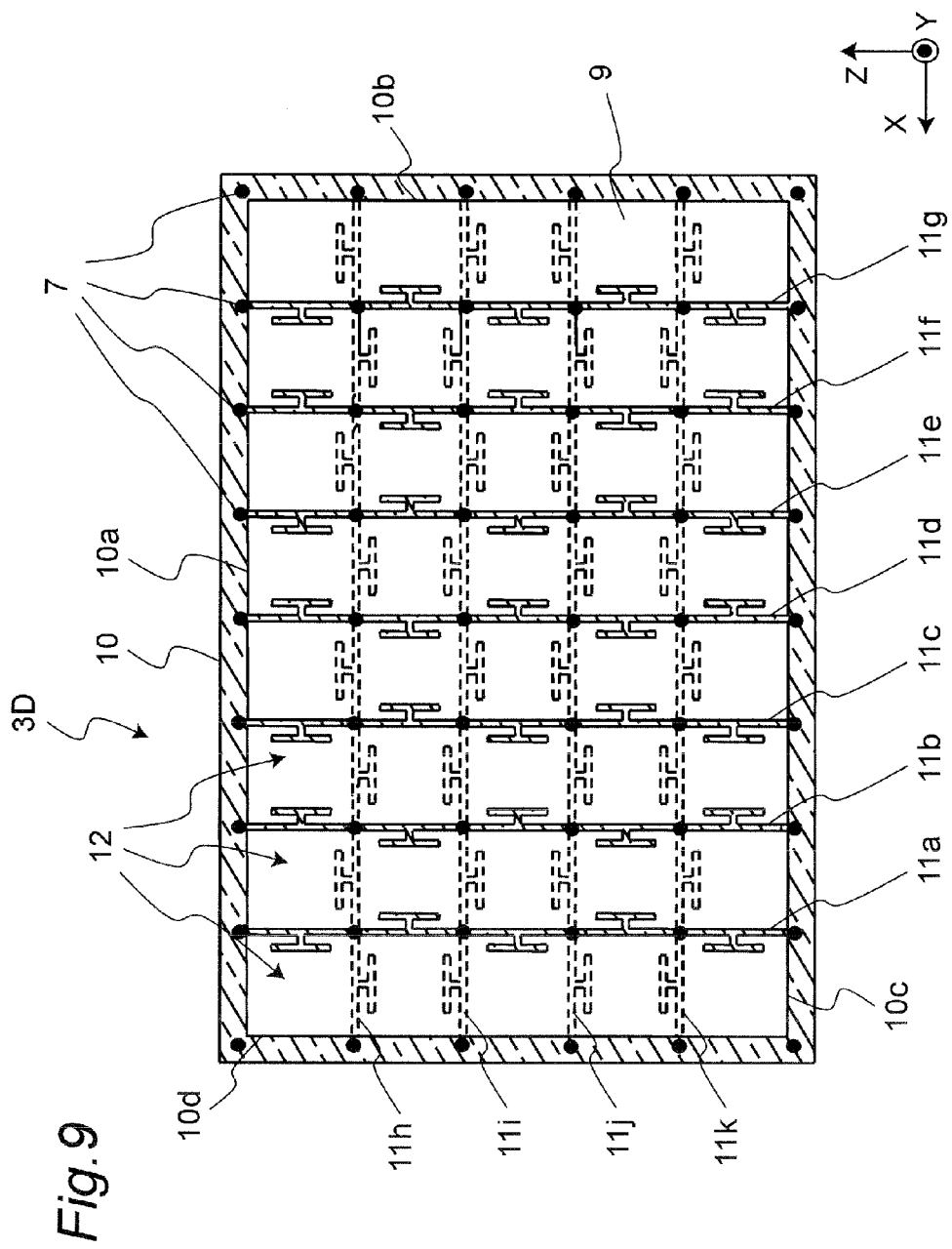
FIG. 9 is a top view showing a configuration of an electromagnetic wave filter apparatus 3D according to a fourth modified embodiment of the embodiment of the present invention.
Figure 10:
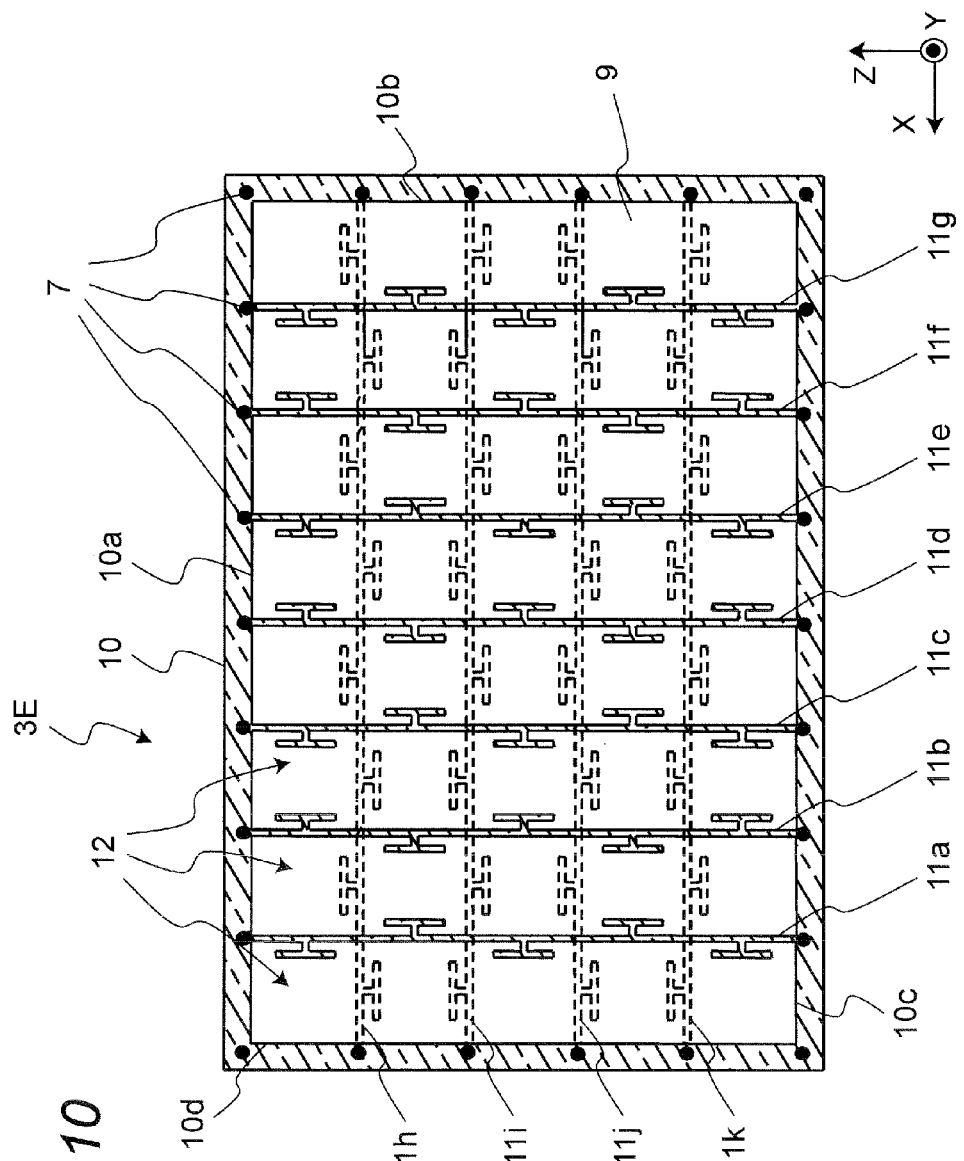
FIG. 10 is a top view showing a configuration of an electromagnetic wave filter apparatus 3E according to a fifth modified embodiment of the embodiment of the present invention.

FIG. 9 is a top view showing a configuration of an electromagnetic wave filter apparatus 3D according to a fourth modified embodiment of the embodiment of the present invention, and FIG. 10 is a top view showing a configuration of an electromagnetic wave filter apparatus 3E according to a fifth modified embodiment of the embodiment of the present invention. The strip conductors 11a to 11g and the strip conductors 11h to 11k of FIG. 3 are not limited to be formed on the same one conductor surface, and may be formed on both conductor surfaces of a dielectric substrate 9 as a double-sided printed wiring board, as shown in FIG. 9. The strip conductors 11a to 11g and the strip conductors 11h to 11k of FIG. 3 are electrically connected to each other at their respective intersection locations, but may be electrically connected to each other at their corresponding locations by means of via conductors 7, as shown in FIG. 9. Alternatively, only some of the strip conductors 11a to 11g and some of the strip conductors 11h to 11k may be electrically connected to each other through via conductors 7, or none of them may be connected to each other as shown in FIG. 10.

Figure 11:
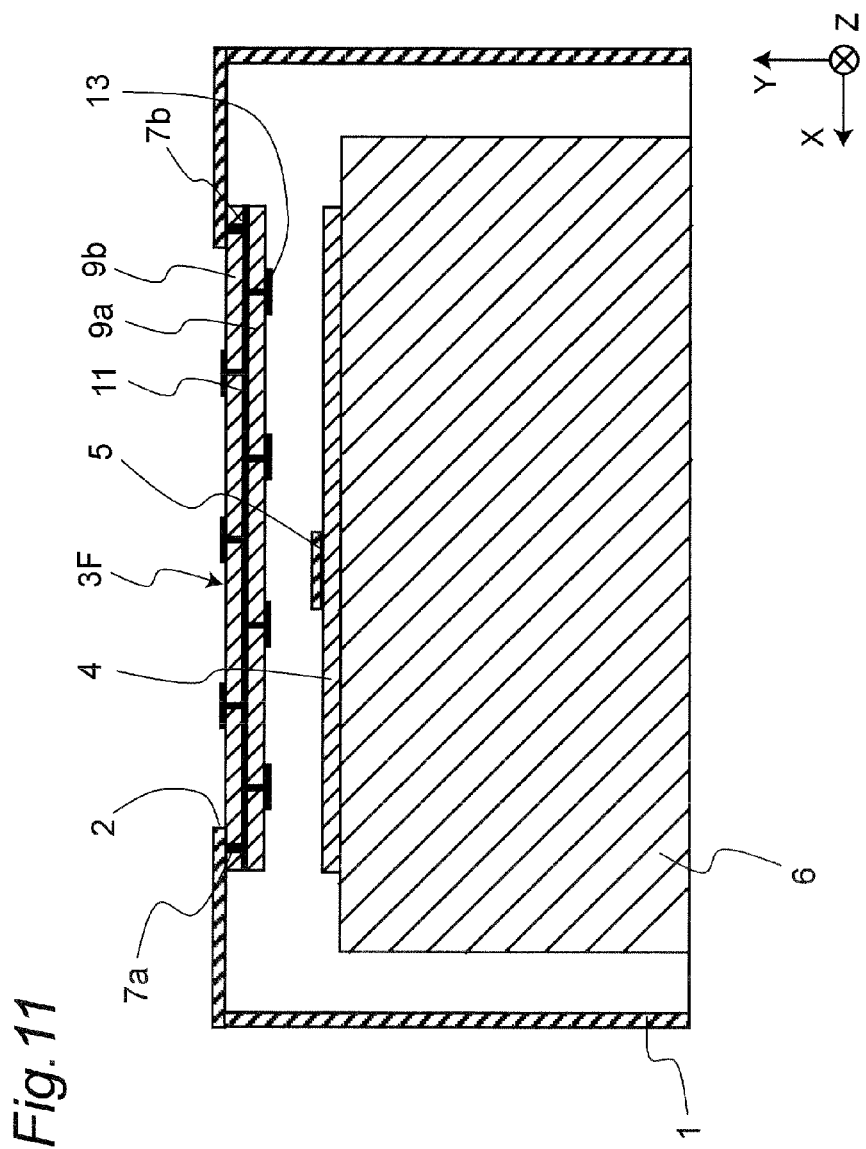
FIG. 11 is a cross-sectional view showing a configuration of a radome with an electromagnetic wave filter apparatus 3F according to a sixth modified embodiment of the embodiment of the present invention.

FIG. 11 is a cross-sectional view showing a configuration of a radome with an electromagnetic wave filter apparatus 3F according to a sixth modified embodiment of the embodiment of the present invention. The electromagnetic wave filter apparatus according to the embodiment of the present invention is not limited to be configured using a printed wiring board with one conductor surface as shown in FIGS. 3 and 7, or using a double-sided printed wiring board as shown in FIGS. 8 and 9. The electromagnetic wave filter apparatus according to the embodiment of the present invention may be configured using a multilayer printed wiring board including three or more conductor layers, and each of the conductor portions of the electromagnetic wave filter apparatus (i.e., a ground conductor 10, strip conductors 11, and stub conductors 13) may be formed on/in at least any one conductor layer of the multilayer printed wiring board. For example, the configuration may be such that the stub conductors 13 are connected along a longitudinal direction of each strip conductor 11, and alternately connected in the +Y direction and the −Y direction, as shown in FIG. 11. Further, the configuration may be such that on any two adjacent ones of the parallel strip conductors 11, one of each pair of stub conductors 13 close to each other between the strip conductors 11 is connected in the +Y direction and the other stub conductor 13 is connected in the −Y direction.

FIGS. 12 to 16 are partial enlarged views showing configurations of stub conductors 13A to 13E according to modified embodiments of the stub conductors 13 of FIG. 4. The stub conductors 13 are preferably formed in T-shape (FIG. 4) or Y-shape (FIG. 12). However, if it is equivalently satisfied that the effective length of each stub conductor 13 corresponds to one-quarter wavelength at a certain frequency fp, then it is possible to obtain the same shielding effect. Accordingly, there is no limitation on the pattern shape of the stub conductors 13. For example, it is possible to use a linear stub conductor 13B of FIG. 13, a fan-shaped radial stub conductor 13C of FIG. 14, a bent stub conductor 13D of FIG. 15 with the branch line being bent to reduce the occupied area, and a meander stub conductor 13E of FIG. 16.

Further, the electromagnetic wave filter apparatus according to the embodiment of the present invention is not limited to the one covering the entire shield aperture 2, and can be provided in any manner as long as the electromagnetic wave filter apparatus is positioned at least partially in front of the antenna element 5 through a space and is operable as a filter for electromagnetic waves to be transmitted from and received by the antenna element 5. Further, the configuration may be such that instead of providing the shield conductor 1 and the ground conductor 10 separately as shown in FIG. 5, the shield conductor 1 is at least partially integrated with the ground conductor 10, e.g., by using the conductor surface of the dielectric substrate 9 as the +Y side surface of the shield conductor 1 of FIG. 1. Further, the electromagnetic wave filter apparatus according to the embodiment of the present invention is not limited to planar. For example, even when the electromagnetic wave filter apparatus has a convex and/or concave, e.g., the electromagnetic wave filter apparatus is configured in a concentric spherical shape around the antenna element 5 as a wave source, it is possible to obtain the effects of the present invention. Thus, even when the electromagnetic wave filter apparatus has a convex and/or concave, the strip conductors 11 can be configured in a manner similar to that of the above described embodiment. For example, the electromagnetic wave filter apparatus is configured in a manner similar to that of FIG. 3 or 9, to include a plurality of first strip conductors 11 provided substantially parallel to a first direction within a surface including a shield aperture 2; and a plurality of second strip conductors provided substantially parallel to a second direction within the surface, intersecting the first direction.

Further, the electromagnetic wave filter apparatus according to the embodiment of the present invention is not limited to be configured at least partially using a dielectric substrate or dielectric material. Provided that there is no problem in the airtightness of electronic equipment inside the shield conductor 1, the electromagnetic wave filter apparatus may be configured such that the strip conductors 11 are completely exposed in air without being supported by dielectric material.

An antenna element shielded by the electromagnetic wave filter apparatus according to the embodiment of the present invention is not limited to a patch antenna, and may be any other antenna such as a linear antenna or a slot antenna. Further, even when the electromagnetic wave filter apparatus according to the embodiment of the present invention serves for an arrayed antenna structure, as well as for a single antenna element, it is possible to obtain the same advantageous effects as that of the present invention As described above, according to the present invention, a plurality of stub conductors 13 operable as bandstop filters are provided on each strip conductor 11, thus it is possible to implement an electromagnetic wave filter apparatus, without degrading radiation characteristics at a certain frequency fp of an antenna shielded by the electromagnetic wave filter apparatus, and with obtaining the effect of blocking noise electromagnetic waves at low frequencies fL, that is difficult to achieve in the prior art.

Example 1

For the purpose of demonstrating the advantageous effects of the present invention, a radome of a first implementation example based on the electromagnetic wave filter apparatus 3B of FIG. 7, and radomes of second and third implementation examples based on the electromagnetic wave filter apparatus 3 of FIG. 3 were fabricated. In addition, radomes of first to fifth comparison examples were fabricated as typical examples of the prior art with which the implementation examples were compared. Those parameters other than the main configuration parameters of the electromagnetic wave filter apparatus were the same for all the fabricated implementation examples and comparison examples. In the following description, XYZ coordinates shown in FIG. 1, etc. are referenced.

As an antenna element 5 to be contained in a shield conductor 1, a vertical polarization patch antenna formed on an antenna substrate 4 made of alumina was used. The antenna element 5 had a size of 0.8 mm×0.95 mm. The resonance frequency was designed to be 60 GHz. Under conditions of providing it in free space, the antenna element 5 obtained a good return loss of −14.2 dB. In addition, when providing the antenna element 5 in free space, the effective gain in a forward direction (Y-axis direction) was 5.35 dBi, the beam half-width in an E-plane (YZ-plane) was 94 degrees, and the beam half-width in an H-plane (XY-plane) was 83 degrees.

A dielectric substrate 9 made of a liquid crystal polymer substrate with a permittivity of 3 and a thickness of 0.25 mm was positioned in the +Y direction from a surface of the antenna element 5 with a space of 1.2 mm. In addition, a shield conductor 1 made of a copper plate with a thickness of 1 mm and having a rectangular shield aperture 2 with 14 mm (X-axis direction)×10 mm (Z-axis direction) was provided on the +Y side of the dielectric substrate 9. The dielectric substrate 9 was configured to have a region corresponding to the shield aperture 2; and a region with a width of 1 mm at an outer edge of the region corresponding to the shield aperture 2, for connecting to the shield conductor 1. Each of the antenna element 5 and the dielectric substrate 9 was provided such that their respective centers were positioned on the Y-axis (i.e., X=0 and Z=0). The shield conductor 1 except for the shield aperture 2 enclosed the antenna substrate 4, and served as a shield structure. As the first comparison example, a radome was configured such that in a shield aperture 2, only a dielectric substrate 9 was provided without conductor portions of an electromagnetic wave filter apparatus.

On the other hand, in each of the second to fifth comparison examples and the first to third implementation examples, conductor portions of the electromagnetic wave filter apparatus were configured by forming copper wirings with a thickness of 18 microns on both sides of a dielectric substrate 9. On a +Y side surface of the dielectric substrate 9, conductor was removed from the entire region except for the region with a width of 1 mm for connecting to a shield conductor 1. On a −Y side surface of the dielectric substrate 9 (a surface on the side close to an antenna element 5), conductor portions of each of electromagnetic wave filter apparatuses shown in FIGS. 3, 7, and 17 to 20 were configured. In the second and third comparison examples and the first to third implementation examples, all the line widths of strip conductors 11 and 21 (including stub conductors 13) were to 100 microns. In addition, at the region for connecting the electromagnetic wave filter apparatus to the shield conductor 1, a plurality of via conductors 7 penetrating through the dielectric substrate 9 were provided along the edge of the shield aperture 2 at every 500 microns. By means of the via conductors 7, the conductor portions on the −Y side surface of the dielectric substrate 9 were electrically connected to the conductor on the +Y side surface, and the conductor on the +Y side surface was connected by plating to the shield conductor 1. That is, the conductor portions of the electromagnetic wave filter apparatus were short-circuited to the shield conductor 1 through this region.

In the second comparison example (see FIG. 17), six linear strip conductors 21a to 21g extending in the Z-axis direction were provided at every 2 mm in the X-axis direction. By means of the strip conductors 21, the shield aperture 2 of the radome according to the second comparison example was divided into a plurality of rectangular apertures 12 each with an area of 2 mm×10 mm. Further, in the third comparison example (see FIG. 18), in addition to being configured in a manner similar as that of the second comparison example, four linear strip conductors 21h to 21k extending in the X-axis direction were provided at every 2 mm in the Z-axis direction. The strip conductors 21a to 21g extending in the Z-axis direction and the strip conductors 21h to 21k extending in the X-axis direction intersected each other and are electrically connected to each other. As a result, the shield aperture 2 of the radome according to the third comparison example was divided into a plurality of apertures 12 which were arranged in a tetragonal lattice and each of which was a square with 2 mm×2 mm. In the fourth comparison example (see FIG. 19), its configuration was substantially the same as that of the second comparison example except for changing only the interval at which the strip conductors 21 were provided, thus designing the resulting apertures 12 to resonate as slots in 60 GHz band. In the fourth comparison example, linear strip conductors extending in the Z-axis direction were provided at every 2 mm in the X-axis direction, and linear strip conductors extending in the X-axis direction were provided at every 0.3 mm in the Z-axis direction. The strip conductors extending in the Z-axis direction were configured with a width of 0.2 mm, and the strip conductors extending in the X-axis direction were configured with a width of 0.21 mm. Thus, each aperture 12 was configured as a rectangular with 1.8 mm (X-axis direction)×90 microns (Z-axis direction). According to preferred conditions described in Patent Literature 2, the aspect ratio of the sides of each rectangular aperture 12 was configured to be 5%. In the fifth comparison example (see FIG. 20), the configuration of the fourth comparison example was modified by providing apertures 12 adjacent in the Z-axis direction with a displacement of ±0.9 mm in the X-axis direction.

On the other hand, in the first implementation example (see FIG. 7), six strip conductors 11a to 11g extending in the Z-axis direction were provided at every 2 mm in the X-axis direction, and each of the strip conductors 11a to 11 g was connected with stub conductors 13 at every 2 mm in the Z-axis direction. Therefore, the configuration of the first implementation example corresponds to the one in which the stub conductors 13 are added to the strip conductors 21 of the second comparison example. Each stub conductor 13 was configured as a T-shaped open circuited stub, as shown in FIG. 4. The length L1 of a conductor portion 14a branched off from a strip conductor 11 was 0.18 mm, two conductor portions 14b and 14c further branched off from the conductor portion 14a were an equal length L2=L3, and the sum of the lengths L2+L3 was 1.0 mm. The center frequency of a stopband due to the stub conductors 13 was 60 GHz. The strip conductors 11 and the stub conductors 13 were formed on the same plane. Further, any two stub conductors 13 adjacent in the X-axis direction were provided in opposite directions relative to corresponding strip conductors 11, and any two stub conductors 13 adjacent in the Z-axis direction were provided in opposite directions relative to a corresponding strip conductor 11. That is, the adjacent stub conductors 13 in each strip conductor 11 were alternately branched off from the strip conductor 11 in opposite directions, and two adjacent stub conductors 13 provided on two adjacent strip conductors 11, respectively, were configured not in the same direction, but opposed to each other. In the second implementation example (see FIG. 3), strip conductors 11a to 11g extending in the Z-axis direction were provided at every 2 mm in the X-axis direction, and strip conductors 11h to 11k extending in the X-axis direction were provided at every 2 mm in the Z-axis direction. In each of square apertures 12 with 2 mm×2 mm formed by the strip conductors 11a to 11k, the same stub conductors 13 as those of the first implementation example were periodically provided at midpoints of respective sides of the square. In addition, the adjacent stub conductors 13 in each strip conductor 11 were alternately branched off from the strip conductor 11 in opposite directions, and two adjacent stub conductors 13 provided on two adjacent strip conductors 11, respectively, were configured not in the same direction, but opposed to each other. In the third implementation example (see FIG. 3), the interval at which the strip conductors 11 were provided in the second implementation example was set to 1.45 mm.

FIG. 21 is a table showing effective gains and beam halfwidths for the implementation examples of the present invention and for the comparison examples. The first to third implementation examples showed effective gains in the forward direction of 4.91 dBi, 4.90 dBi, and 4.88 dBi, respectively. According to these values, it can be seen that their degradations were only less than 0.5 dB as compared to the antenna characteristics in the case of free space. On the other hand, the second to fourth comparison examples showed effective gains in the forward direction of 2.69 dBi, 2.87 dBi, and 3.31 dBi, respectively, and their degradations reached 2.66 dB, 2.47 dB, and 2.04 dB. It was demonstrated that the configurations of radomes according to the embodiment of the present invention had a smaller change in the radiation characteristics as compared to those of the prior art. The fifth comparison example showed an effective gain in the forward direction of 4.8 dBi, and the degradation was only 0.57 dB, i.e., an equivalent level to those of the first to third implementation examples. However, according to the fifth comparison example, the beam half-width in the E-plane reached 110 degrees, thus producing a significant change from a beam half-width of 94 degrees obtained in the case of free space. In addition, the beam half-width in the H-plane was 75 degrees, thus decreasing by 8 degrees. Further, also in the second to fourth comparison examples, significant changes in beam half-width appeared. On the other hand, in all of the first to third implementation examples, the changes in beam half-width in the E-plane and the H-plane were within 3 degrees, thus demonstrating the effects of the present invention.

Figure 22:
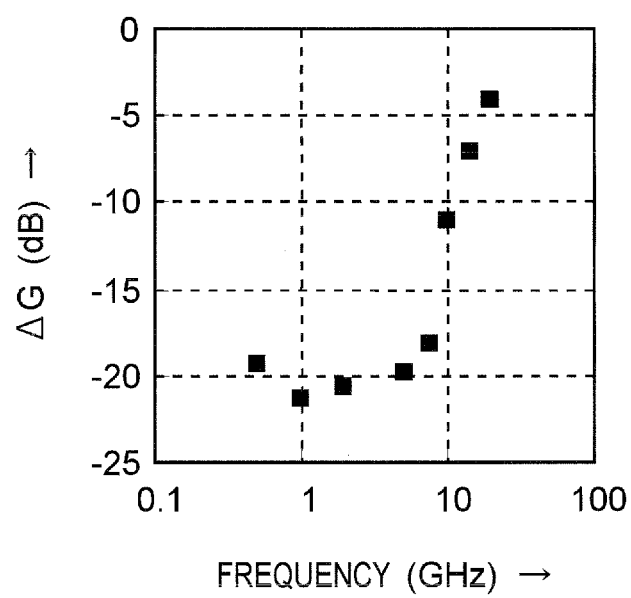
FIG. 22 is a graph showing radiation gain versus frequency for a first implementation example of the present invention and for the first comparison example.

FIG. 22 is a graph showing radiation gain versus frequency for the first implementation example of the present invention and for the first comparison example. In the radomes of the first to third implementation examples and the radome of the first comparison example, a vertical polarization antenna element 5 (small patch antenna) with resonant characteristics at frequencies lower than 60 GHz was provided at the center of the shield aperture 2, and the radiation characteristics of electromagnetic waves passing through the electromagnetic wave filter apparatus (in the case of the first comparison example, the dielectric substrate 9 of the electromagnetic wave filter apparatus) were measured in the forward direction. According to all of the first to third implementation examples, the radiation gain was effectively suppressed in the entire measured frequency band over the first comparison example, thus demonstrating the effects of the present invention. FIG. 22 shows the frequency-dependent characteristics of the suppression of undesired radiation gain for the first implementation example and for the first comparison example. According to FIG. 22, in a frequency band lower than 10 GHz, a stable suppression of about 20 dB was achieved irrespective of frequency, thus demonstrating the low-frequency shielding effect of the present invention. Similarly, also in the second and third implementation examples, the low-frequency shielding effect of the present invention was demonstrated.

FIG. 23 is a table showing return losses for the implementation examples of the present invention and for the comparison examples. FIG. 23 shows return loss values for the operating frequency of 60 GHz. The second to fourth comparison examples showed return loss values of −8.85 dB, −8.07 dB, and −8.67 dB, respectively, which exceeded −10 dB, thus revealing that the strip conductors 21 in the electromagnetic wave filter apparatus adversely affected not only the antenna radiation characteristics, but also reflection characteristics. In the fifth comparison example, although the return loss was −10.4 dB, the significant change in beam half-width appeared as described with reference to FIG. 21. On the other hand, the return losses in the first to third implementation examples were −12.1 dB, −12.6 dB, and −12.9 dB, respectively. These values below 10 dB are good, thus demonstrating an effect in which a radio frequency current with a certain frequency does not flow through the strip conductors 11 in the configurations of the present invention.

An electromagnetic wave filter apparatus according to the present invention can reduce the intensity of passing electromagnetic waves at low frequencies without degrading the radiation characteristics of passing electromagnetic waves with a certain frequency, that is difficult to obtained by prior art electromagnetic wave filter apparatuses. Thus, the electromagnetic wave filter apparatus is useful particularly in applications implementing communications and radars requiring both high gain and wide steering capabilities, such as, in particular, indoor millimeter-wave communication and on-board millimeter-wave radar. In addition, the electromagnetic wave filter apparatus can be used in applications requiring sophisticated controls of antenna directivity, such as base station antennas of a mobile phone system, and in applications using MIMO techniques.

REFERENCE SIGNS LIST

1: shield conductor,
2: shield aperture,
3, 3A to 3F: electromagnetic wave filter apparatus,
4: antenna substrate,
5: antenna element,
6: dielectric support,
7, 7a, and 7b: via conductor,
9: dielectric substrate,
10: ground conductor,
10a to 10d: side of inner edge of ground conductor 10,
11, 11a to 11k: strip conductor,
12: aperture,
13a to 13c and 13A to 13E: stub conductor,
14a, 14b, and 14c: conductor portion,
15: region on strip conductor 11a,
16a and 16b: path on strip conductor 11a,
20 and 20A to 20C: electromagnetic wave filter apparatus, and
21a to 21k: strip conductor.

The invention claimed is:

1. An electromagnetic wave filter apparatus for blocking electromagnetic waves with frequencies lower than a predetermined frequency, the electromagnetic wave filter apparatus comprising:
a ground conductor disposed at a part of a shield conductor which is provided so as to enclose an antenna element;
a first aperture provided in the ground conductor;
a plurality of strip conductors, each of which is connected to the ground conductor at both ends thereof, and which divide the first aperture into a plurality of second apertures which are disposed so as to be open in a radiation direction of the antenna element; and
a plurality of bandstop filters provided at intervals on each of the strip conductors such that each of the bandstop filters prevents a current with the predetermined frequency from flowing through a corresponding strip conductor due to an electromagnetic wave with the predetermined frequency traveling through the second apertures of the electromagnetic wave filter apparatus, whereby the electromagnetic wave filter apparatus passes the electromagnetic wave with the predetermined frequency without exerting substantial influence on radiation of the electromagnetic wave with the predetermined frequency.

2. The electromagnetic wave filter apparatus as claimed in claim 1,
wherein each of the bandstop filters is an open circuited stub conductor with a length corresponding to one-quarter of an effective wavelength at the predetermined frequency.

3. The electromagnetic wave filter apparatus as claimed in claim 2,
wherein each of the open circuited stub conductors has a T-shape or Y-shape.

4. The electromagnetic wave filter apparatus as claimed in claim 3,
wherein each of the open circuited stub conductors has a first conductor portion connected to a corresponding strip conductor, and second and third conductor portions branched off from a tip of the first conductor portion, the second and third conductor portions having an equal line width and an equal length to each other.

5. The electromagnetic wave filter apparatus as claimed in claim 4,
   wherein in each of the open circuited stub conductors, the second and third conductor portions are configured to be mirror symmetric with respect to a plane including the first conductor portion.

6. The electromagnetic wave filter apparatus as claimed in claim 2,
   wherein each of the open circuited stub conductors is configured to be mirror symmetric with respect to a plane perpendicular to a longitudinal direction of a corresponding strip conductor in a position in which the open circuited stub conductor is connected to the corresponding strip conductor.

7. The electromagnetic wave filter apparatus as claimed in claim 2,
   wherein in each of the strip conductors, the open circuited stub conductors are connected along a longitudinal direction of the strip conductor, and alternately connected in a first direction and a second direction opposite to each other.

8. The electromagnetic wave filter apparatus as claimed in claim 7,
   wherein at least some of the strip conductors are provided parallel to each other, and
   wherein in any two adjacent strip conductors among the parallel strip conductors, one of each pair of open circuited stub conductors close to each other between the strip conductors is connected in the first direction and the other open circuited stub conductor is connected in the second direction.

9. The electromagnetic wave filter apparatus as claimed in claim 2,
   wherein at least a part of the conductor portions of each of the open circuited stub conductors is provided in parallel to a direction in which electromagnetic waves travel through the second apertures of the electromagnetic wave filter apparatus.

10. The electromagnetic wave filter apparatus as claimed in claim 1,
    wherein in each of the strip conductors, the bandstop filters are provided at intervals of a length not corresponding to an N/2 wavelength at the predetermined frequency, where N is an integer.

11. The electromagnetic wave filter apparatus as claimed in claim 1,
    wherein the strip conductors include:
    a plurality of first strip conductors provided in parallel to a third direction within a surface including the first aperture; and
    a plurality of second strip conductors provided in parallel to a fourth direction within the surface, intersecting the third direction.

12. The electromagnetic wave filter apparatus as claimed in claim 11,
    wherein the first strip conductors are formed on a first surface of a double-sided printed wiring board,
    wherein the second strip conductors are formed on a second surface of the double-sided printed wiring board, and
    wherein at least some of the first strip conductors and at least some of the second strip conductors are connected to each other by via conductors.

13. The electromagnetic wave filter apparatus as claimed in claim 1,
    wherein in a printed wiring board including one or more conductor layers, the strip conductors and the bandstop filters is formed on one or more of the conductor layers, respectively.

14. A radome comprising an electromagnetic wave filter apparatus for blocking electromagnetic waves with frequencies lower than a predetermined frequency, the electromagnetic wave filter apparatus comprising:
    a ground conductor disposed at a part of a shield conductor which is provided so as to enclose an antenna element;
    a first aperture provided in the ground conductor;
    a plurality of strip conductors, each of which is connected to the ground conductor at both ends thereof, and which divide the first aperture into a plurality of second apertures which are disposed so as to be open in a radiation direction of the antenna element; and
    a plurality of bandstop filters provided at intervals on each of the strip conductors such that each of the bandstop filters prevents a current with the predetermined frequency from flowing through a corresponding strip conductor due to an electromagnetic wave with the predetermined frequency traveling through the second apertures of the electromagnetic wave filter apparatus, whereby the electromagnetic wave filter apparatus passes the electromagnetic wave with the predetermined frequency without exerting substantial influence on radiation of the electromagnetic wave with the predetermined frequency.

* * * * *